United States Patent
Heidari et al.

(10) Patent No.: US 9,754,053 B2
(45) Date of Patent: Sep. 5, 2017

(54) SYSTEM AND METHOD FOR READING GEOMETRIC DATA FROM A COMPUTER-AIDED DESIGN (CAD) MODEL

(71) Applicant: The Boeing Company, Chicago, IL (US)

(72) Inventors: Mohammad Ali Heidari, Bellevue, WA (US); Anthony K. Gilbert, Tacoma, WA (US); James S. Lee, Woodinville, WA (US); Omid B. Nakhjavani, Mill Creek, WA (US); Eric S. Lester, Marysville, WA (US); Arun Kannayiram Jeyavelu, Everett, WA (US); Ayusman Tripathy, Everett, WA (US)

(73) Assignee: The Boeing Company, Chicago, IL (US)

( * ) Notice: Subject to any disclaimer, the term of this patent is extended or adjusted under 35 U.S.C. 154(b) by 583 days.

(21) Appl. No.: 14/457,110

(22) Filed: Aug. 11, 2014

(65) Prior Publication Data

US 2016/0042094 A1 Feb. 11, 2016

(51) Int. Cl.
G06F 3/00 (2006.01)
G06F 17/50 (2006.01)

(52) U.S. Cl.
CPC .................. *G06F 17/50* (2013.01)

(58) Field of Classification Search
CPC ..................................................... G06F 17/50
USPC ............................................................ 703/1
See application file for complete search history.

(56) References Cited

U.S. PATENT DOCUMENTS

| | | | | |
|---|---|---|---|---|
| 5,819,062 | A | * 10/1998 | Srikantappa | G06F 17/50 345/440 |
| 8,666,714 | B2 | * 3/2014 | Whirley | G09B 23/28 623/1.11 |
| 9,097,697 | B2 | * 8/2015 | Naito | G01N 33/44 |
| 2007/0100565 | A1 | 5/2007 | Gosse et al. | |
| 2012/0249530 | A1 | * 10/2012 | Fukushima | G02B 27/2214 345/419 |
| 2012/0253763 | A1 | 10/2012 | Herbstreit | |

OTHER PUBLICATIONS

Shumin Zhai, User Performance in Relation to 3D Input Device Design, Nov. 1998.*

* cited by examiner

*Primary Examiner* — Lechi Truong

(57) ABSTRACT

There is provided a system for reading geometric data from parametric model or a nonparametric model from a CAD model file. The system has a processor and an interface application, which when executed by the processor, is configured to operably receive automatically, using a first interface application, an input file that includes data representing one or more components of a three-dimensional model, and is further configured to operably determine, using the first interface application, a type of a part represented by the three-dimensional model. The first interface application has instructions, one or more algorithms, or a combination thereof, and is further configured to automatically operably identify, select, and group geometric data associated with specific geometric data of the three-dimensional model, based on a set of parametric rules. The processor writes extracted specific geometric data to a first geometry intermediate output file.

20 Claims, 16 Drawing Sheets

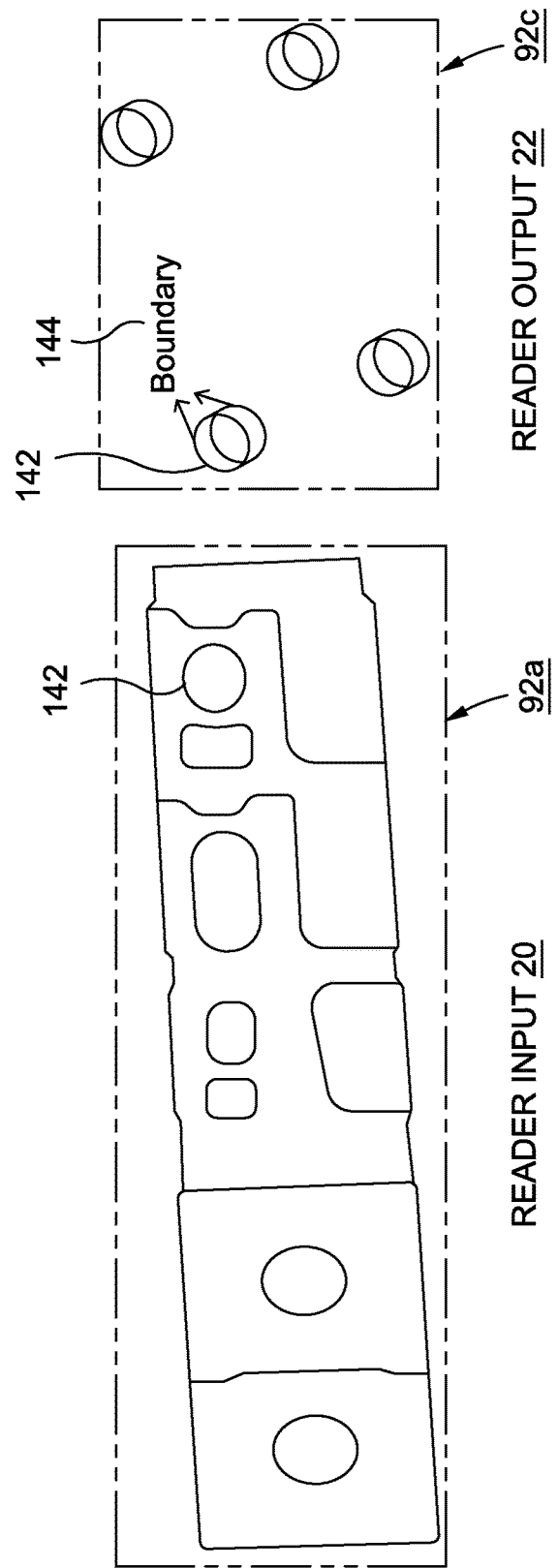

READER OUTPUT 22

READER INPUT 20

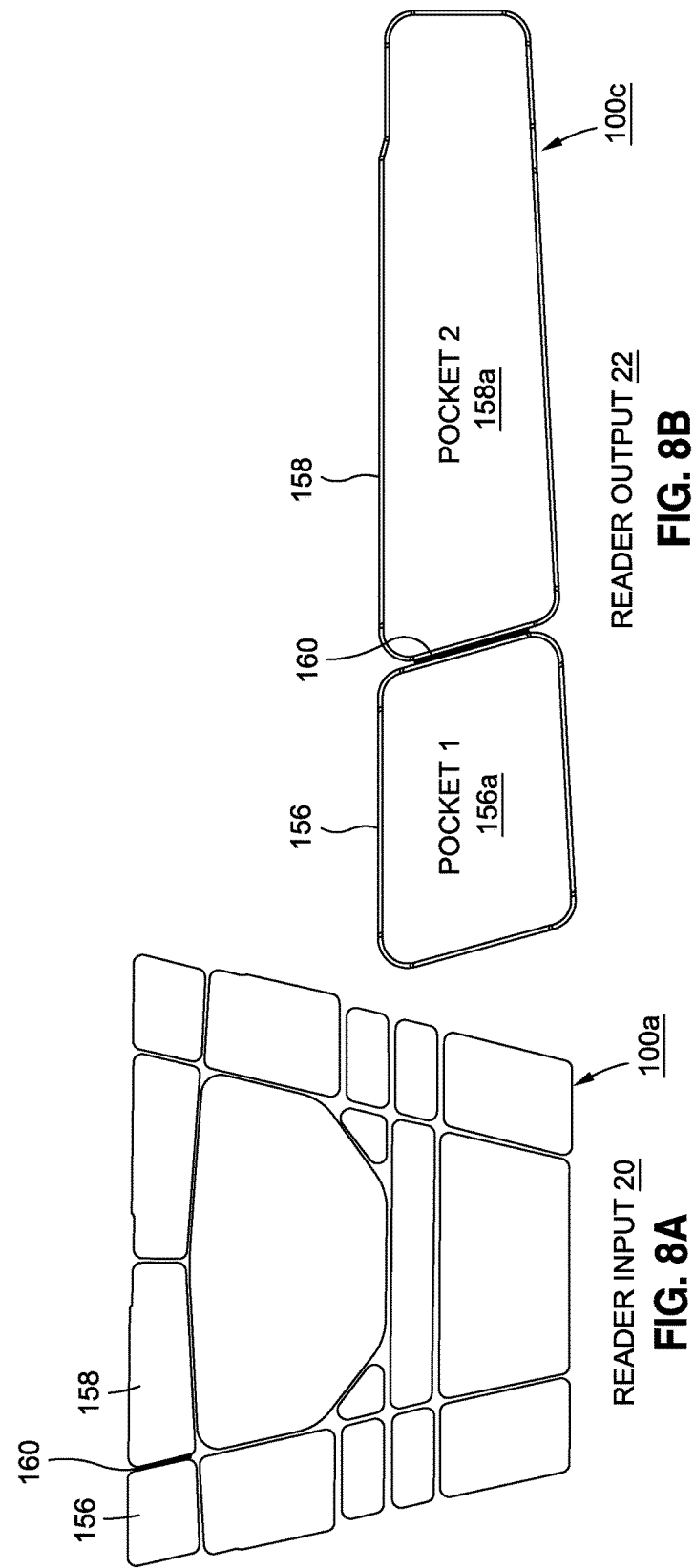

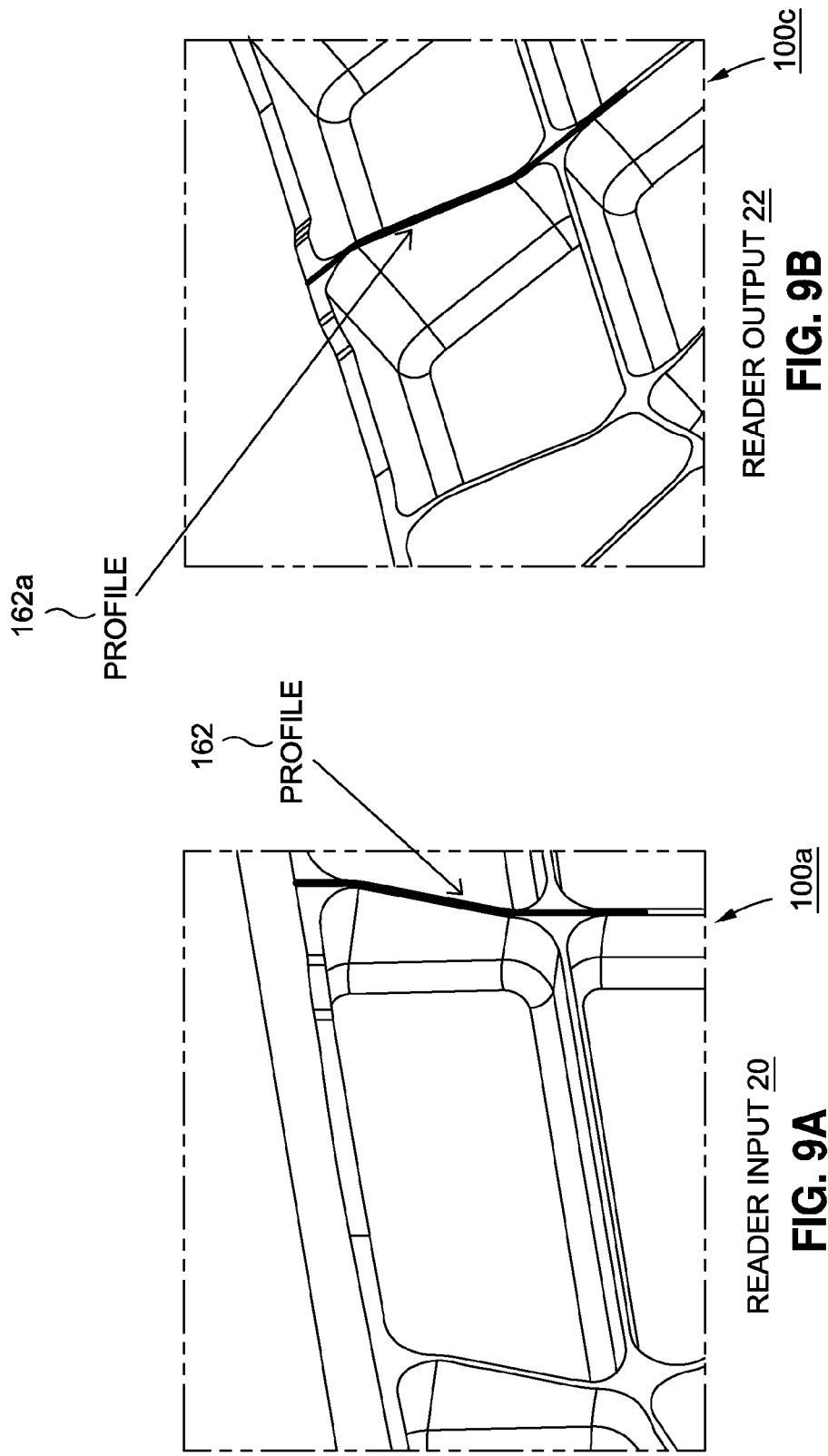

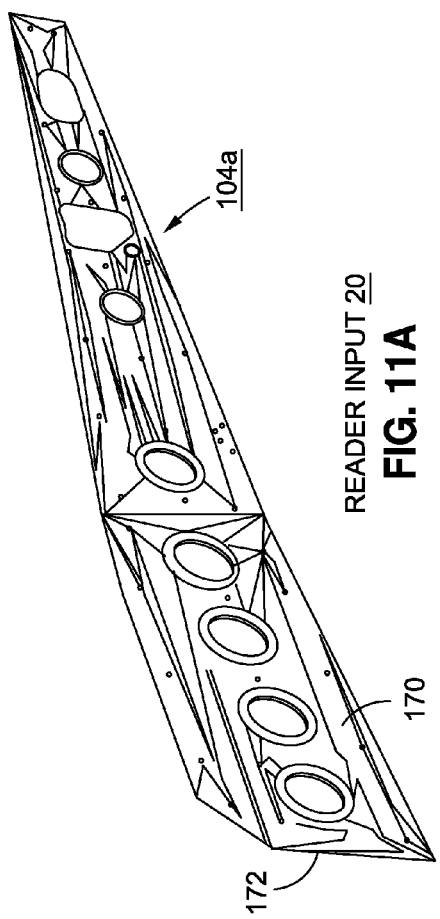
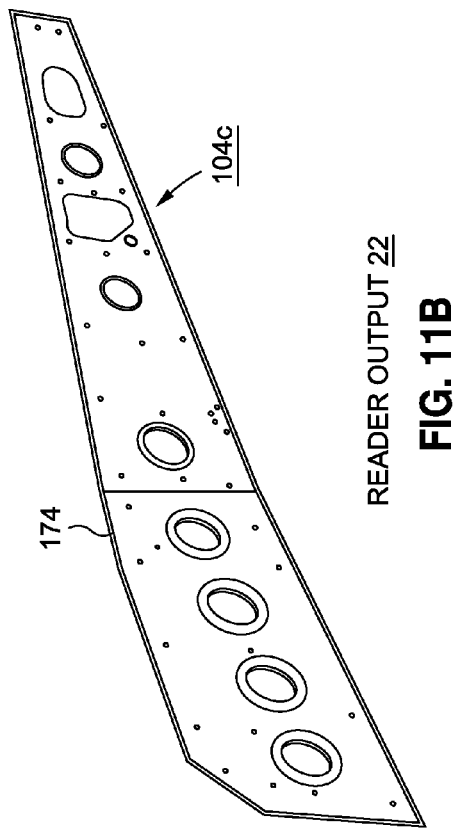
FIG. 11A READER INPUT 20
FIG. 11B READER OUTPUT 22

SYSTEM AND METHOD FOR READING GEOMETRIC DATA FROM A COMPUTER-AIDED DESIGN (CAD) MODEL

BACKGROUND

1) Field of the Disclosure

The disclosure relates generally to computer-aided design (CAD) modeling systems and methods, and more particularly, to computer-aided design (CAD) modeling systems and methods, such as computer aided three-dimensional interactive application (CATIA) part model file systems and methods, for reading geometric data from a CAD model.

2) Description of Related Art

Systems and methods exist for reading geometric features of a computer-aided design (CAD) model, such as a computer aided three-dimensional interactive application (CATIA) part model, i.e., a dumb solid or model (dumb solid means there are no parameters associated with it) with a geometry tree, and converting a CATIA V4 (version four) model to a parameterized CATIA V5 (version 5) model. However, such existing systems and methods may require extensive effort, manual labor, expertise, and numerous hours to convert the CATIA V4 to the CATIA V5.

Moreover, automatically capturing the design attributes of the geometric features in an intermediate output file to build a parameterized CATIA V5 model of the component with a standard tree structure may be difficult. In addition, such existing systems and methods may not be able to capture all the geometric features automatically and may require more manual work to make that happen, and there may still be no guarantee for full conversion from CATIA V4 to CATIA V5.

Accordingly, there is a need in the art for an improved system and method for reading geometric data from a CAD model, such as a CATIA model, that provide advantages over known systems and methods.

SUMMARY

Example implementations of the present disclosure provide an improved system and method for reading geometric data from a CAD model, such as a CATIA model, to overcome the difficult and laborious nature of existing CATIA V4 to CATIA V5 conversion solutions. As discussed in the below detailed description, embodiments of the improved system and method for reading geometric data from a CAD model, such as a CATIA model, may provide significant advantages over existing systems and methods.

In one embodiment there is provided a system for reading geometric data from a parametric model or a nonparametric model from a computer-aided design (CAD) model file. The system comprises a processor. The system further comprises an interface application, which when executed by the processor, is configured to operably receive automatically, using a first interface application, an input file of a three-dimensional model comprising data representing one or more components of the three-dimensional model, and is further configured to operably determine, using the first interface application, a type of a part represented by the three-dimensional model.

The first interface application comprises instructions, one or more algorithms, or a combination thereof, and is further configured to automatically operably identify, select, and group geometric data associated with specific geometric data of the three-dimensional model, based on a set of parametric rules, and to operably extract from the input file, a portion of the geometric data representing the specific geometric data, to obtain extracted specific geometric data. The portion of the geometric data representing the specific geometric data is extracted automatically by the first interface application.

The processor writes the extracted specific geometric data to an output file comprising a first geometry intermediate output file, based on the extracted specific geometric data. The first geometry intermediate output file comprises language-neutral data for the part from which a finite element model may be generated to form a part model, after the type of the part represented by the three-dimensional model is determined and after the extracted specific geometric data is extracted.

In another embodiment there is provided a system for reading geometric data from a parametric model or a nonparametric model from a computer-aided design (CAD) model file. The system comprises a processor. The system further comprises a reader system coupled to the processor. The reader system comprises a reader tool configured to receive reader inputs from an input file and configured to generate reader output to an output file.

The reader tool comprises an interface application, which when executed by the processor, is configured to operably receive automatically, using a first interface application, the input file of a three-dimensional model comprising data representing one or more components of the three-dimensional model, and is further configured to operably determine, using the first interface application, a type of a part represented by the three-dimensional model. The first interface application comprises instructions, one or more algorithms, or a combination thereof, and is further configured to automatically operably identify, select, and group geometric data associated with specific geometric data of the three-dimensional model, based on a set of parametric rules, and to operably extract from the input file, a portion of the geometric data representing the specific geometric data, to obtain extracted specific geometric data.

The portion of the geometric data representing the specific geometric data is extracted automatically by the first interface application. The processor writes the extracted specific geometric data to the output file comprising a first geometry intermediate output file, based on the extracted specific geometric data. The first geometry intermediate output file comprises language-neutral data for the part from which a finite element model may be generated to form a part model, after the type of the part represented by the three-dimensional model is determined and after the extracted specific geometric data is extracted.

In another embodiment there is provided a computer-executable method for reading geometric data from a parametric model or a nonparametric model from a computer-aided design (CAD) model file. The method comprises the step of reading with a first interface application executed by a computer, a first input file comprising data representing one or more components of a three-dimensional model. The method further comprises determining with the first interface application executed by the computer, a type of a part represented by the three-dimensional model.

The method further comprises identifying, selecting and grouping with the first interface application, geometric data associated with specific geometric data of the three-dimensional model, based on a set of parametric rules. The method further comprises extracting automatically by the first interface application from the first input file, a portion of the geometric data representing the specific geometric data of the three-dimensional model, to obtain extracted specific geometric data.

The method further comprises writing with the computer, the extracted specific geometric data to a first geometry intermediate output file, based on the extracted specific geometric data. The first geometry intermediate output file comprises language-neutral data for the type of the part from which a finite element model may be generated to form a part model, after determining the type of the part represented by the three-dimensional model and after extracting the extracted specific geometric data.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 5A is an illustration of reader input for a component solid;

FIG. 5B is an illustration of reader output for circular hole features of the component solid of FIG. 5A;

FIG. 8A is an illustration of reader input of pocket surfaces for adjacent pockets and stiffeners shared between the adjacent pockets;

FIG. 8B is an illustration of reader output of pocket and stiffener features of the pocket surfaces of FIG. 8A;

FIG. 9A is an illustration of reader input for pocket and stiffener surfaces;

FIG. 9B is an illustration of reader output for pocket and stiffener features of the pocket and stiffener surfaces of FIG. 9A;

FIG. 11A is an illustration of reader input for a component boundary;

FIG. 11B is an illustration of reader output of component boundary features of the component boundary of FIG. 11A;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and fully convey the scope of the disclosure to those skilled in the art.

Figure 1A:
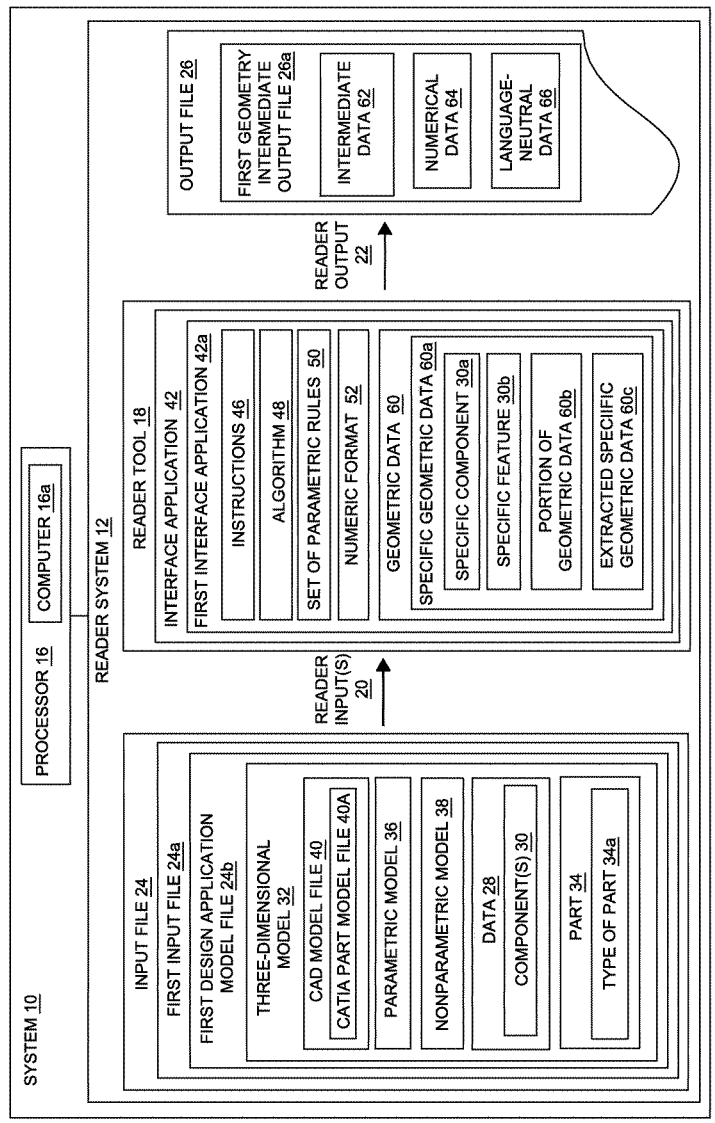
FIG. 1A is an illustration of a system block diagram showing an embodiment of a reader system of a system of the disclosure.
Figure 1B:
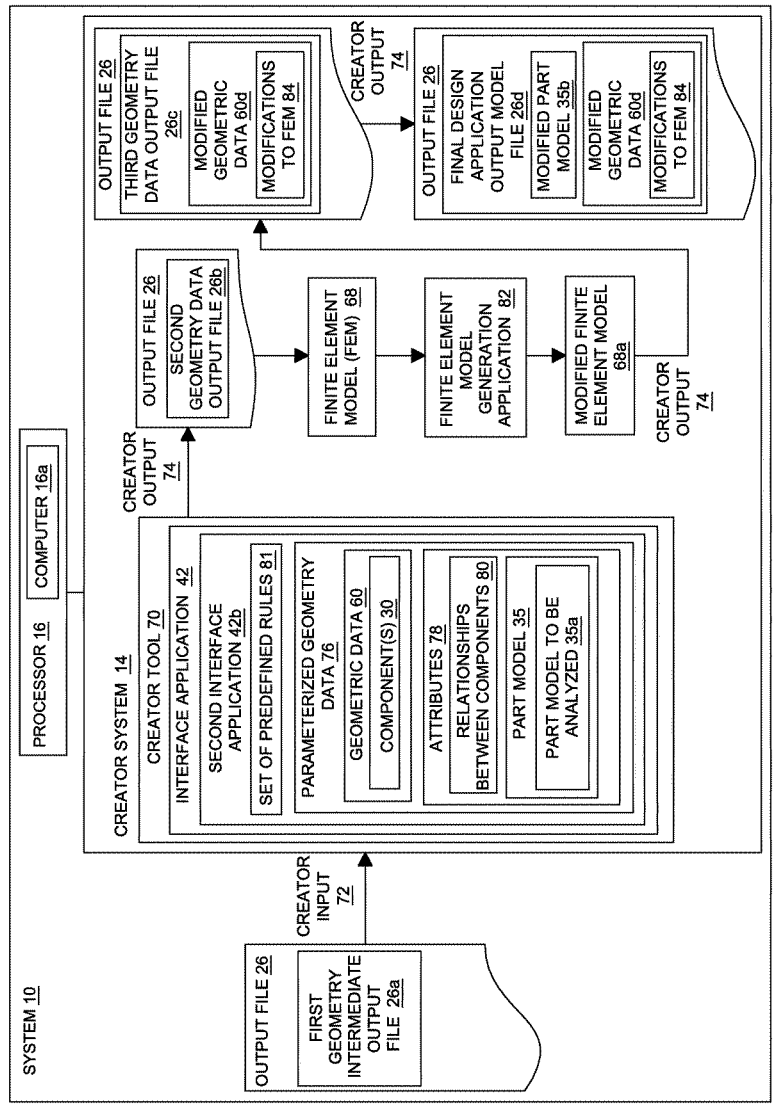
FIG. 1B is an illustration of a system block diagram showing an embodiment of a creator system of a system of the disclosure.

Now referring to the Figures, FIGS. 1A-1B are illustrations of system block diagrams showing an embodiment of a system 10 of the disclosure. In particular, FIG. 1A is an illustration of a system block diagram showing an embodiment of a reader system 12 of the system 10 of the disclosure, and FIG. 1B is an illustration of a system block diagram showing an embodiment of a creator system 14 of the system 10 of the disclosure.

As shown in FIGS. 1A-1B, the system 10 comprises a processor 16 coupled to the reader system 12 (see FIG. 1A) and to the creator system 14 (see FIG. 1B). The processor 16 (see FIGS. 1A-1B) preferably comprises a computer 16a (see FIGS. 1A-1B).

As shown in FIG. 1A, the reader system 12 comprises a reader tool 18 that is configured to receive reader input(s) 20 and is configured to generate reader output 22. The reader tool 18 (see. FIG. 1A) is configured to receive the reader input(s) 20 (see FIG. 1A) from an input file 24 (see FIG. 1A) and is configured to generate the reader output 22 (see FIG. 1A) to an output file 26 (see FIG. 1A).

In one embodiment there is provided the system 10 (see FIG. 1A) for reading geometric; data 60 (see FIG. 1A) from a parametric model 36 (see FIG. 1A) or a nonparametric model 38 (see FIG. 1A) from a computer-aided design (CAD) model file 40 (see FIG. 1A). The system 10 (see FIG. 1A) comprises an interface application 42 (see FIG. 1A), which when executed by the processor 16 (see FIG. 1A), is configured to operably receive automatically, using a first interface application 42a (see FIG. 1A), an input file 24 (see FIG. 1A) of a three-dimensional model 32 (see FIG. 1A).

As shown in FIG. 1A, the input file 24 is preferably in the form of a first input file 24a, and more preferably, in the form of a first design application model file 24b. The input file 24 (see FIG. 1A), such as in the form of first input file 24a (see FIG. 1A), comprises data 28 (see FIG. 1A) representing one or more components 30 (see FIG. 1A) of the three-dimensional model (see FIG. 1A) of a part 34 (see FIG. 1A).

The three-dimensional model 32 (see FIG. 1A) may be the parametric model 36 (see FIG. 1A) or the nonparametric model 38 (see FIG. 1A) from the computer-aided design (CAD) model file 40 (see FIG. 1A). The computer-aided design (CAD) model file 40 (see FIG. 1A) preferably comprises a computer aided three-dimensional interactive application (CATIA) part model file 40a (see FIG. 1A).

When executed by the processor 16 (see FIG. 1A), the interface application 42 (see FIG. 1A), such as in the form of first interface application 42a (see FIG. 1A), is operable to read with the reader tool 12 (see FIG. 1A), the input file 24 (see FIG. 1A), such as in the form of first input file 24a (see FIG. 1A). The reader tool 12 (see FIG. 1A) is operable to select user inputs 44 (see FIG. 3B) from the reader input(s) 20.

As further shown in FIG. 1A, the interface application 42, such as in the form of first interface application 42a, preferably comprises instructions 46, one or more algorithms 48, or a combination thereof, and a set of parametric rules 50. When executed by the processor 16 (see FIG. 1A), the interface application 42 (see FIG. 1A), such as in the form of first interface application 42a (see FIG. 1A), is operable to convert the reader input(s) 20 (see FIG. 1A) into a numeric format 52 (see FIG. 1A).

When executed by the processor 16 (see FIG. 1A), the interface application 42 (see FIG. 1A), such as in the form of first interface application 42a (see FIG. 1A), is further configured to operably determine a type 34a (see FIG. 1A) of a part 34 (see FIG. 1A) represented by the three-dimensional model 32 (see FIG. 1A). A part model 35 (see FIG. 1B) may be formed based on one or more parts 34 (see FIG. 1A) and the type 34a (see FIG. 1A) of the part 34 (see FIG. 1A). Preferably, the type 34a (see FIG. 1A) of the part 34 (see FIG. 1A) is associated with one of a panel 54 (see FIGS. 3A, 13) such as a wing panel 54a (see FIG. 13), a frame 56 (see FIG. 3A), or a chord 58 (see FIG. 3A), such as may be used in an air vehicle 200 (see FIG. 13), for example, in the form of an aircraft 200a (see FIG. 13). The type 34a (see FIG. 1A) of the part 34 (see FIG. 1A) may also comprise generic geometric information 118 (see FIG. 3A).

When executed by the processor 16 (see FIG. 1A), the interface application 42 (see FIG. 1A), such as in the form of first interface application 42a (see FIG. 1A), is further configured to automatically operably identify, select, and group geometric data 60 (see FIG. 1A) associated with specific geometric data 60a (see FIG. 1A) of the three-dimensional model 32 (see FIG. 1A), based on the set of parametric rules 50 (see FIG. 1A).

When executed by the processor 16 (see FIG. 1A), the interface application 42 (see FIG. 1A), such as in the form of first interface application 42a (see FIG. 1A), is further configured to operably extract from the first input file 24a (see FIG. 1A), a portion 60b (see FIG. 1A) of the geometric data 60 (see FIG. 1A) representing the specific geometric data 60a (see FIG. 1A), to obtain extracted specific geometric data 60c (see FIG. 1A). The specific geometric data 60a (see FIG. 1A) of the three-dimensional model 32 (see FIG. 1A) preferably comprises a specific component 30a (see FIG. 1A) of the three-dimensional model 32 (see FIG. 1A), a specific feature 30b (see FIG. 1A) of the three-dimensional model 32 (see FIG. 1A), or a combination thereof.

The portion 60b (see FIG. 1A) of the geometric data 60 (see FIG. 1A) representing the specific geometric data 60a (see FIG. 1A) is extracted automatically by the first interface application 42a (see FIG. 1A). As shown in FIG. 1A, the processor 16 writes the extracted specific geometric data 60c to an output file 26, such as in the form of a first geometry intermediate output file 26a, based on the extracted specific geometric data 60c.

The first geometry intermediate output file 26a (see FIG. 1A) comprises intermediate data 62 (see FIG. 1A) in the form of numerical data 64 (see FIG. 1A) and comprises language-neutral data 66 (see FIG. 1A) for the part 34 (see FIG. 1A). A finite element model 64 (see FIG. 1B) may be generated from the part 34 (see FIG. 1A) to form the part model 35 (see FIG. 1B), after the type 34a (see FIG. 1A) of the part 34 (see FIG. 1A) represented by the three-dimensional model 32 (see FIG. 1A) is determined, and after the extracted specific geometric data 60c (see FIG. 1A) is extracted.

The reader tool 12 (see FIG. 1A) is thus configured to automatically operably receive reader input 20 (see FIG. 1A) from the first input file 24a (see FIG. 1A) via the first interface application 42a (see FIG. 1A) and the processor 16 (see FIG. 1A). In addition, the reader tool 12 (see FIG. 1A) is configured to automatically operably read, convert and extract the geometric data 60 (see FIG. 1A), and is configured to automatically operably generate and write reader output 22, such as intermediate data 62, to the first geometry intermediate output file 26a.

Referring to FIG. 1B, an embodiment of the creator system 14 of the system 10 is shown. The creator system 14 (see FIG. 1B) is coupled to the reader system 12 (see FIG. 1A). As shown in FIG. 1B, the creator system 14 comprises a creator tool 70 that is configured to receive creator input 72 and is configured to generate one or more creator outputs 74. The creator tool 70 (see FIG. 1B) is configured to receive the creator input 72 (see FIG. 1B) from the first geometry intermediate output file 26a (see FIG. 1B) and is configured to generate the one or more creator outputs 74 (see FIG. 1B) to one or more output files 26 (see FIG. 1B), such as a second geometry data output file 26b (see FIG. 1B), a third geometry data output file 26c (see FIG. 1B), and a final design application output model file 26d (see FIG. 1B).

As shown in FIG. 1B, the system 10 further comprises a second interface application 42b. When executed by the processor 16 (see FIG. 1B), the interface application 42 (see FIGS. 1A-1B) is further configured to automatically operably create, using the second interface application 42b (see FIG. 1B), parameterized geometry data 76 (see FIG. 1B). The parameterized geometry data 76 (see FIG. 1B) comprises geometric data 60 (see FIG. 1B) for one or more components 30 (see FIG. 1B) of the part model 35 (see FIG. 1B). The parameterized geometry data 76 (see FIG. 1B) further comprises attributes 78 (see FIG. 1B) defining relationships 80 (see FIG. 1B) between the one or more components 30 (see FIG. 1B) of the part model 35 (see FIG. 1B), based on a set of predefined rules 81 (see FIG. 1B).

When executed by the processor 16 (see FIG. 1B), the interface application 42 (see FIGS. 1A-1B) is further configured to automatically operably write, using the second interface application 42b (see FIG. 1B), the parameterized geometry data 76 (see FIG. 1B) to an output file 26 (see FIG. 1B), such as in the form of a second geometry data output file 26b (see FIG. 1B), corresponding to a part model to be analyzed 35a (see FIG. 1B). The creator output 74 (see FIG. 1B) is used to generate the second geometry data output file 26b (see FIG. 1B).

When executed by the processor 16 (see FIG. 1B), the interface application 42 (see FIGS. 1A-1B) is further configured to automatically operably generate, using the second interface application 42b (see FIG. 1B), and without user input 44 (see FIG. 3B), the finite element model (FEM) 68 (see FIG. 1B) from the second geometry data output file 26b (see FIG. 1B).

As shown in FIG. 1B, the interface application 42, is further configured to operably modify, using the second interface application 42b (see FIG. 1B), the finite element model 68 to form a modified finite element model 68a using a finite element model generation application 82. As further shown in FIG. 1B, the interface application 42, is further configured to automatically operably write, without user input 44 (see FIG. 3B), a third geometry data output file 26c. The third geometry data output file 26c (see FIG. 1B) comprises modified geometric data 60d (see FIG. 1B) for the one or more components 30 (see FIG. 1B) of the part model 35 (see FIG. 1B), based on modifications 84 (see FIG. 1B) made to the finite element model 68 (see FIG. 1B).

As further shown in FIG. 1B, the interface application 42, is further configured to automatically operably generate, using the second interface application 42b (see FIG. 1B), without user input 44 (see FIG. 3B), an output file 26, such as in the form of a final design application output model file 26d, of the modified part model 35b from the third geometry data output file 26c. The final design application output model file 26d comprises the modified geometric data 60d (see FIG. 1B) for the one or more components 30 (see FIG. 1B) of the part model 35 (see FIG. 1B), based on the modifications 84 (see FIG. 1B) made to the finite element model 68 (see FIG. 1B).

Figure 2:
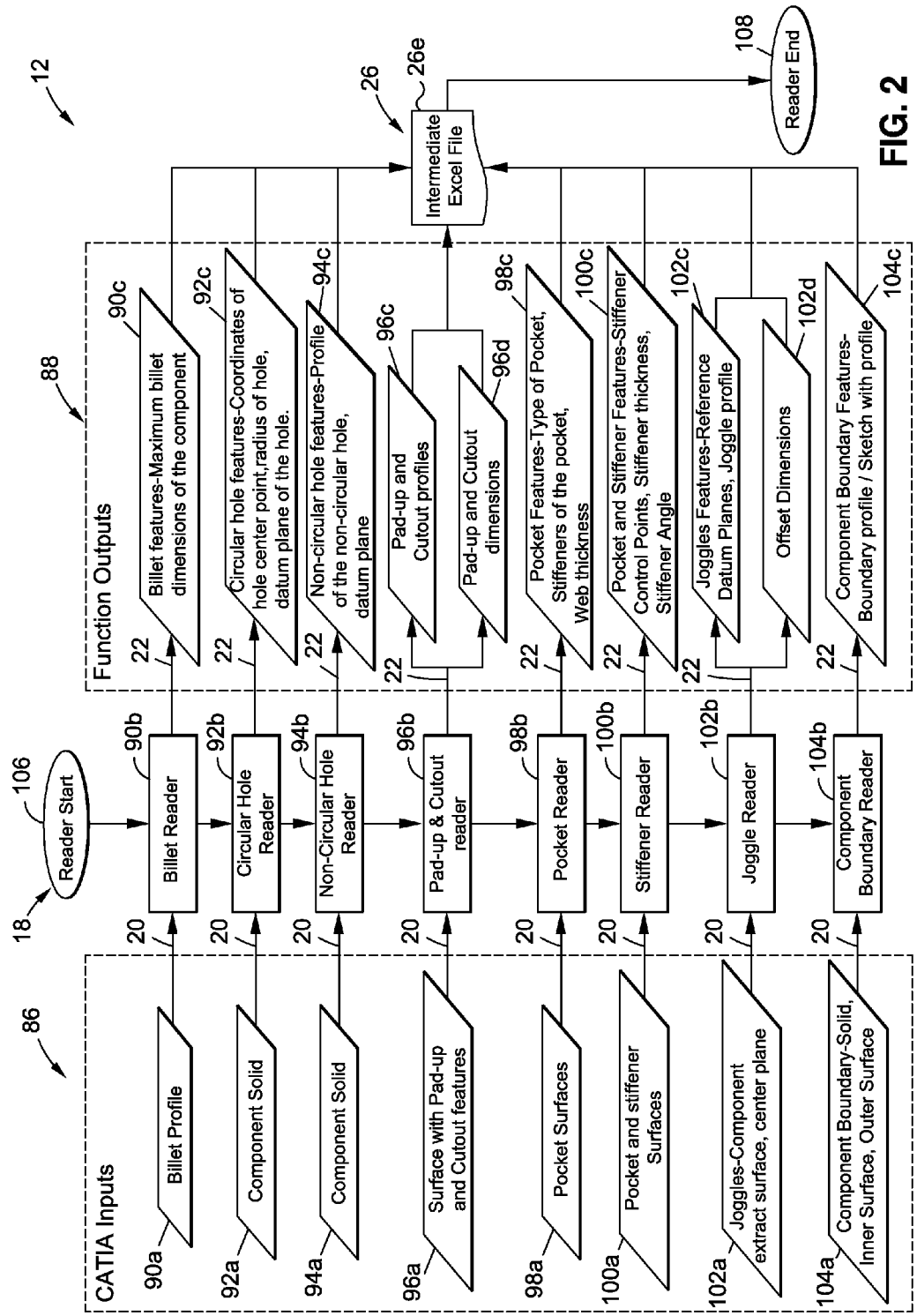
FIG. 2 is an illustration of a flow diagram showing an embodiment of a reader system of the disclosure.

FIG. 2 is an illustration of a flow diagram showing an embodiment of functions of the reader system 12 of the disclosure. FIG. 2 shows a plurality of CATIA inputs 86 that may be input into the reader tool 18. As shown in FIG. 2, the CATIA inputs 86 may comprise a billet profile 90a, a component solid 92a, a component solid 94a, a surface with pad-up and cutout features 96a, pocket surfaces 98a, pocket and stiffener surfaces 100a, joggles 102a, such as component extract surface and center plane, and boundary trims 104a, such as solid, inner surface, and outer surface.

As further shown in FIG. 2, once the CATIA inputs 86, such as in the form of reader inputs 20, are input into the reader tool 18, the reader tool 18 starts reading the CATIA inputs 86 with a reader start command 106. As further shown in FIG. 2, the reader tool 18 may comprise a billet reader 90b, a circular hole reader 92b, a non-circular hole reader 94b, a pad-up and cutout reader 96b, a pocket reader 98b, a stiffener reader 100b, a joggle reader 102b, and a component boundary reader 104b.

FIG. 2 further shows function outputs 88 for each of the CATIA inputs 86 that the reader tool 18 reads. As further shown in FIG. 2, the function outputs 88 may comprise billet features 90c such as maximum billet dimension of the component; circular hole features 92c such as coordinates of hole center point, radius of hole, datum plane of hole; non-circular hole features 94c such as profile of the non-circular hole, datum plane; pad-up and cutout profiles 96c; pad-up and cutout dimensions 96d; pocket features 98c such as type of pocket, stiffeners of the pocket, web thickness; pocket and stiffener features 100c such as pocket numbering, stiffener control points, stiffener thickness, stiffener angle; joggle features 102c such as reference datum planes, joggle profile; joggle features 102d such as offset dimensions; and component boundary features 104c such as boundary profile/sketch with profile.

As shown in FIG. 2, the reader tool 18 is configured to generate reader output 22 and is configured to operably write the function outputs 88 into an output file 26, such as in the form of an intermediate Excel file 26e. The reader tool 18 stops writing to the intermediate Excel file 26e with a reader end command 108.

Figure 3A:
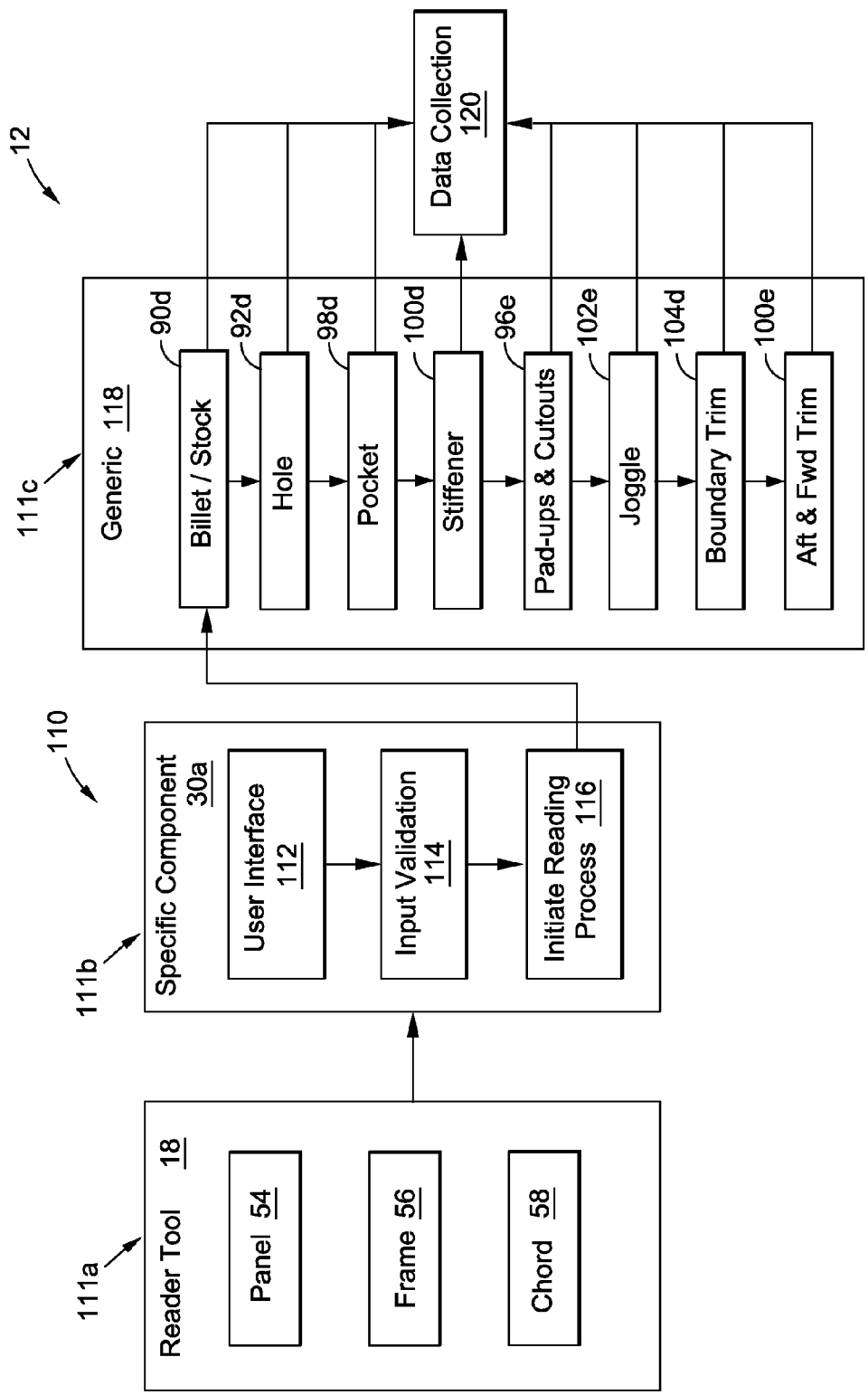
FIG. 3A is an illustration of a process flow diagram for a reader system process flow using a reader tool of a reader system of the disclosure.

FIG. 3A is an illustration of a process flow diagram for a reader system process flow 110 using the reader tool 18 of the reader system 12 of the disclosure. As shown in FIG. 3A, the reader tool 18 comprises in a main layer 111a the type 34a (see FIG. 1A) of the part 34 (see FIG. 1A) associated with a panel 54, such as a wing panel 54a (see FIG. 13), a frame, and a chord 58 (see FIG. 3A), such as may be used in an air vehicle 200 (see FIG. 13), for example, in the form of an aircraft 200a (see FIG. 13).

As further shown in FIG. 3A, the reader system 12 comprises a component specific layer 111b for a specific component 30a. The specific component 30a (see FIG. 3A) may comprise a user interface 112, an input validation 114, and an initiate reading process 116.

As further shown in FIG. 3A, the reader system 12 comprises a generic layer 111c having generic geometric information 118. The generic geometric information 118 may comprise billet/stock generic information 90d, hole generic information 92d, pocket generic information 98d, stiffener generic information 100d, pad-ups and cutouts generic information 96e, joggle generic information 102e, component boundary trim generic information 104d, and aft and forward trim generic information 100e. As shown in FIG. 3A, the reader tool 18 collects the output of the generic layer 111c in a data collection 120.

Figure 3B:
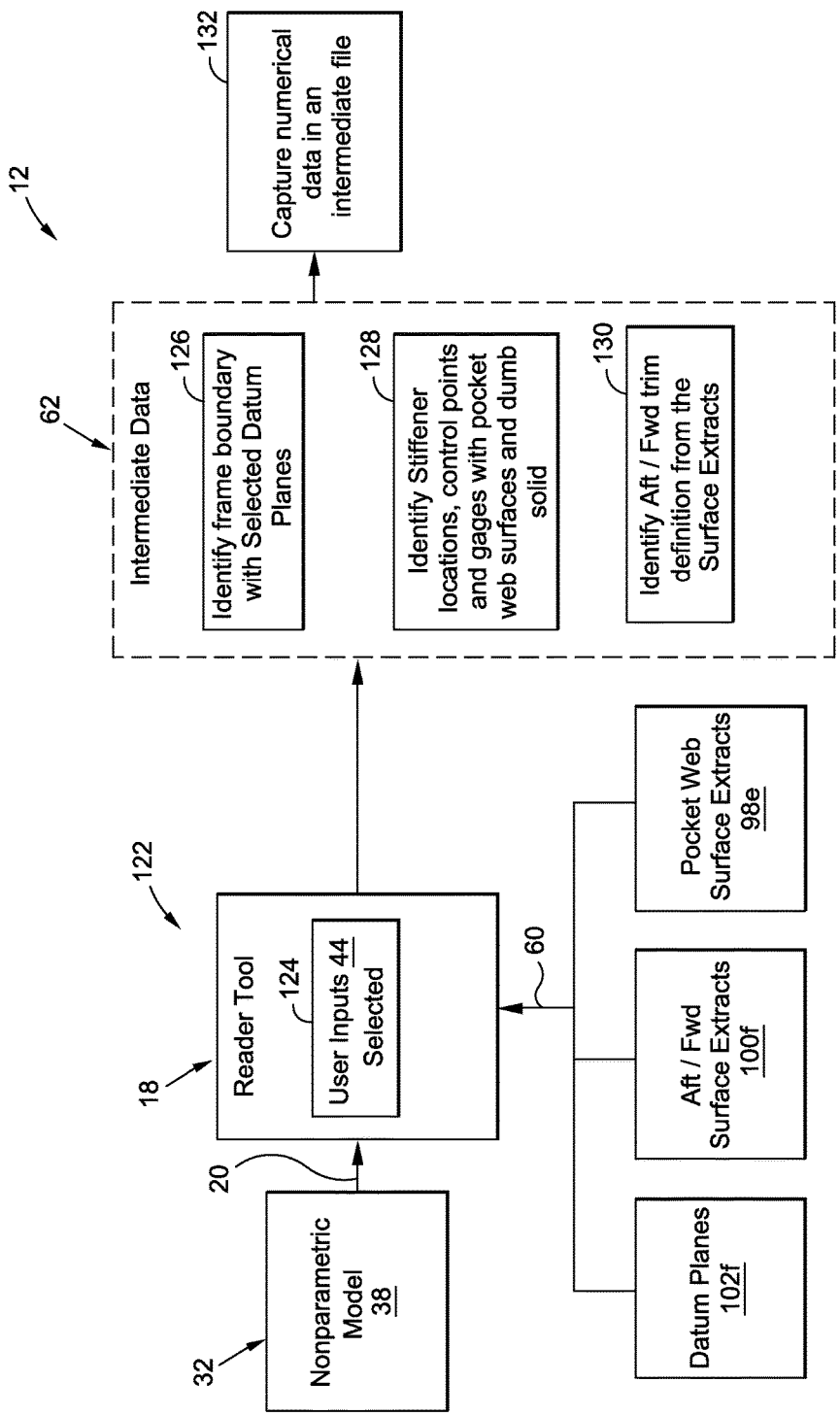
FIG. 3B is an illustration of a process flow diagram for a reader tool flow for a frame using a reader tool of a reader system of the disclosure.

FIG. 3B is an illustration of a process flow diagram for a reader tool flow 122 for a part 34 (see FIG. 1A) such as a frame 56 (see FIG. 3A) using the reader tool 18 of the reader system 12 of the disclosure. As shown in FIG. 3B, the reader tool 18 is configured to receive reader input 20 from the three-dimensional model 32, such as a nonparametric model 38, and is configured to receive geometric data 60. As further shown in FIG. 3B, the geometric data 60 may comprise datum planes 102f, aft/forward (fwd) surface extracts 100f, and pocket web surface extracts 98e.

The reader tool 18 (see FIG. 3B) receives user inputs 44 (see FIG. 3B) and selects the user inputs 44 with the user inputs selected command 124 (see FIG. 3B). As shown in FIG. 3B, the reader tool 18 of the reader system 12 generates intermediate data 62. For example, the intermediate data 62 may comprise identifying actions such as identify frame boundary with selected datum planes identifying action 126, identify stiffener locations, control points and gages with pocket web surfaces and dumb solid identifying action 128, and identify aft/forward trim definition from the surface extract identifying action 130. As further shown in FIG. 3B, the reader tool 18 performs capture numerical data in an intermediate file action 132.

Figure 4B:
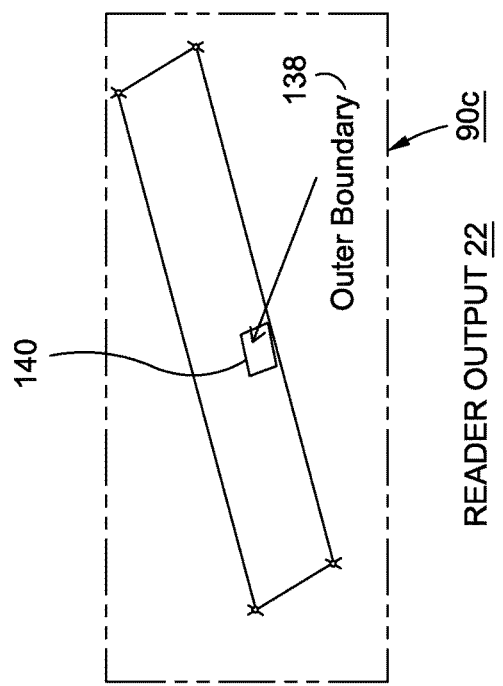
FIG. 4B is an illustration of reader output for billet features of the billet profile of FIG. 4A.
Figure 4A:
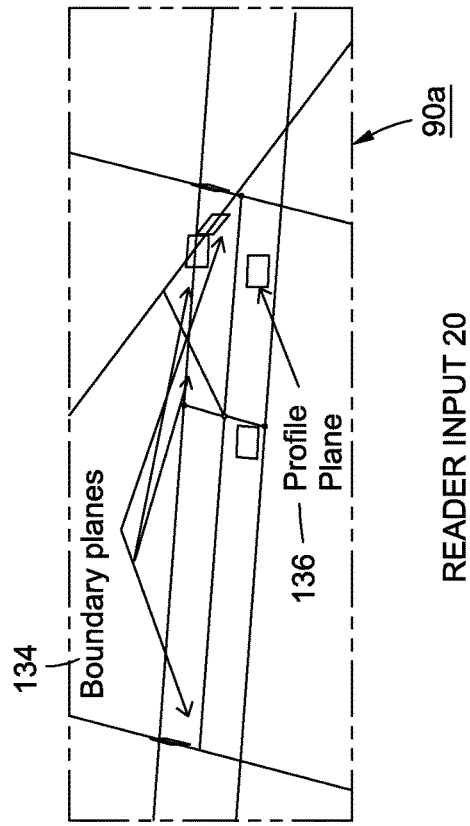
FIG. 4A is an illustration of reader input for a billet profile.

FIG. 4A is an illustration of reader input 20 for a billet profile 90a. FIG. 4A shows boundary planes 134 and a profile plane 136 of the billet profile 90a. FIG. 4B is an illustration of reader output 22 for billet features 90c of the billet profile 90a of FIG. 4A. FIG. 4B shows the reader output 22 of a single profile outer boundary 138 created from a closed boundary profile 140 for the billet profile 90a of FIG. 4A. The billet features 90c (see FIG. 2) may preferably comprise maximum billet dimensions of the component.

The billet reader 90b (see FIG. 2) of the reader tool 18 (see FIG. 2) reads the billet profile 90a (see FIG. 5A) and uses an algorithm 48 (see FIG. 1A) to create the closed boundary profile 140 (see FIG. 5B) with the boundary planes 134 and the profile planes 136. The algorithm 48 (see FIG. 1A) of the first interface application 42a (see FIG. 1A) sorts the boundary planes 134 (see FIG. 4A) in sequence irrespective of the order of creation of the boundary planes 134 (see FIG. 4A). The boundary planes 134 (see FIG. 4A) may preferably be in a number of three or more boundary planes 134 (see FIG. 4A). The algorithm 48 (see FIG. 1A) may receive one or more profile planes 136 (see FIG. 4A). The profile planes 136 (see FIG. 4A) are planes on which the closed boundary profile 140 is created. The algorithm 48 (see FIG. 1A) uses the reader input 20 of the boundary planes 134 (see FIG. 4A) and the profile planes 136 (see FIG. 4A) to create the closed boundary profile 140 (see FIG. 4B), and the closed boundary profile 140 (see FIG. 4B) is used for creating the reader output 22 of the single profile outer boundary 138 (see FIG. 4B).

FIG. 5A is an illustration of reader input 20 for a component solid 92a with one or more holes 142. FIG. 5B is an illustration of reader output 22 for circular hole features 92c of the component solid 92a of FIG. 5A. FIG. 5B shows a boundary 144 of each of the one or more holes 142. The circular hole features 92c (see FIGS. 2, 5B) may include, for example, coordinates of the hole center point, radius of the hole, and datum plane of the hole.

The circular hole reader 92b (see FIG. 2) of the reader tool 18 (see FIG. 2) reads the component solid 92a (see FIG. 5A) and uses an algorithm 48 (see FIG. 1A) to identify all the holes 142 (see FIG. 5A) present in the component solid 92a (see FIG. 5A) and to extract the respective positions and dimensions of the holes 142 (see FIG. 5A). The algorithm 48 (see FIG. 1A) of the first interface application 42a (see FIG. 1A) may use known topology operations in the CATIA part model file 40a (see FIG. 1A) to identify surfaces of the holes 142 (see FIG. 5A) from other surfaces. Holes 142 (see FIG. 5A) of all sizes may be retrieved using the algorithm 48 (see FIG. 1A). The holes 142 (see FIG. 5B) may be read from any component solid and not restricted to only panels 54 (see FIG. 3A), frames 56 (see FIG. 3A), and chords 58 (see FIG. 5A). Thus, the holes 142 have generic geometric information 118 (see FIG. 3A) for feature identification and include hole generic information 92d (see FIG. 3A).

The reader tool 18 (see FIG. 2) may also comprise a non-circular hole reader 94b (see FIG. 2) that reads a component solid 94a (see FIG. 2) and that generates reader output 22 (see FIG. 2) for non-circular hole features 94c (see FIG. 2) of the component solid 94a (see FIG. 2). The non-circular hole features 94c (see FIG. 2) may include, for example, profile of the non-circular hole and datum plane.

Figure 6B:
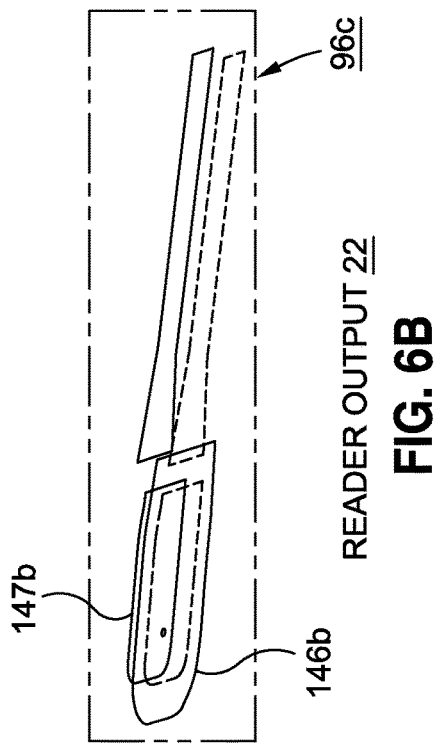
FIG. 6B is an illustration of reader output for pad-up and cutout profiles for the surface with pad-up and cutout features of FIG. 6A.
Figure 6A:
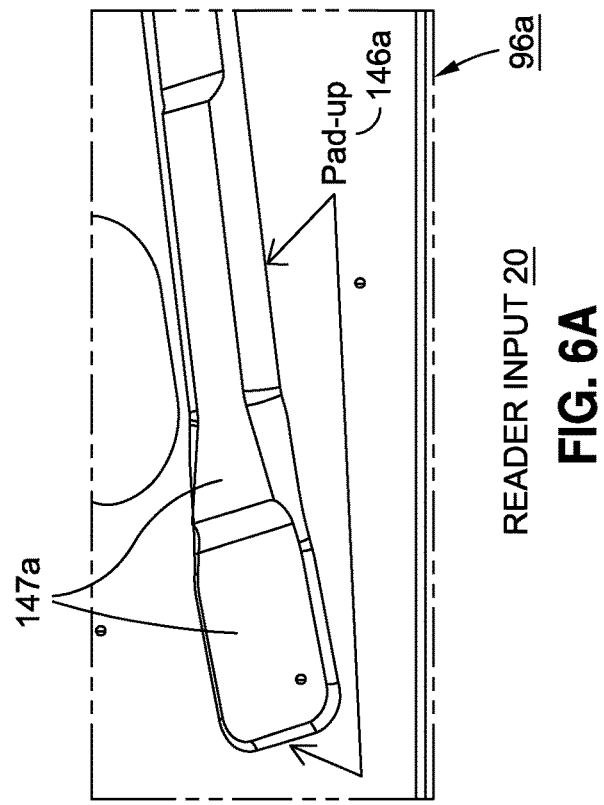
FIG. 6A is an illustration of reader input for a surface with pad-up and cutout features.

FIG. 6A is an illustration of reader input 20 for a surface with pad-up and cutout features 96a. FIG. 6A shows pad-up features 146a and cutout features 147a. FIG. 6B is an illustration of reader output 22 for pad-up and cutout profiles 96c for the surface with pad-up and cutout features 96a of FIG. 6A. FIG. 6B shows a pad-up profile 146a and a cutout profile 147b of the surface with pad-up and cutout features 96a of FIG. 6A. The reader output 22 may also comprise pad-up and cutout dimensions 96d (see FIG. 2).

The pad-up and cutout reader 96b (see FIG. 2) of the reader tool 18 (see FIG. 2) reads the pad-up features 146a (see FIG. 6A) and the cutout features 147a (see FIG. 6A) and uses the algorithm 48 (see FIG. 1A) to identify the pad-up features 146a (see FIG. 6A) and the cutout features 147a (see FIG. 6A) and to differentiate these features from other typical thickness regions. The pad-up features 146a (see FIG. 6A) and the cutout features 147a (see FIG. 6A) are located based on the thickness difference and the localization of each of the features. Pad-up profiles 146b (see FIG. 6B) and cutout profiles 147b (see FIG. 6B) are identified and recreated using the algorithm 48 (see FIG. 1A). If any transition regions are present, the algorithm 48 (see FIG. 1A) will create profiles for the transition regions. A combination of the pad-up features 146a (see FIG. 6A) and the cutout features 147a (see FIG. 6A), for example, the pad-up feature 146a (see FIG. 6A) contains the cutout feature 147a (see FIG. 6A), may also be identified using the algorithm 48 (see FIG. 1A).

Figure 7B:
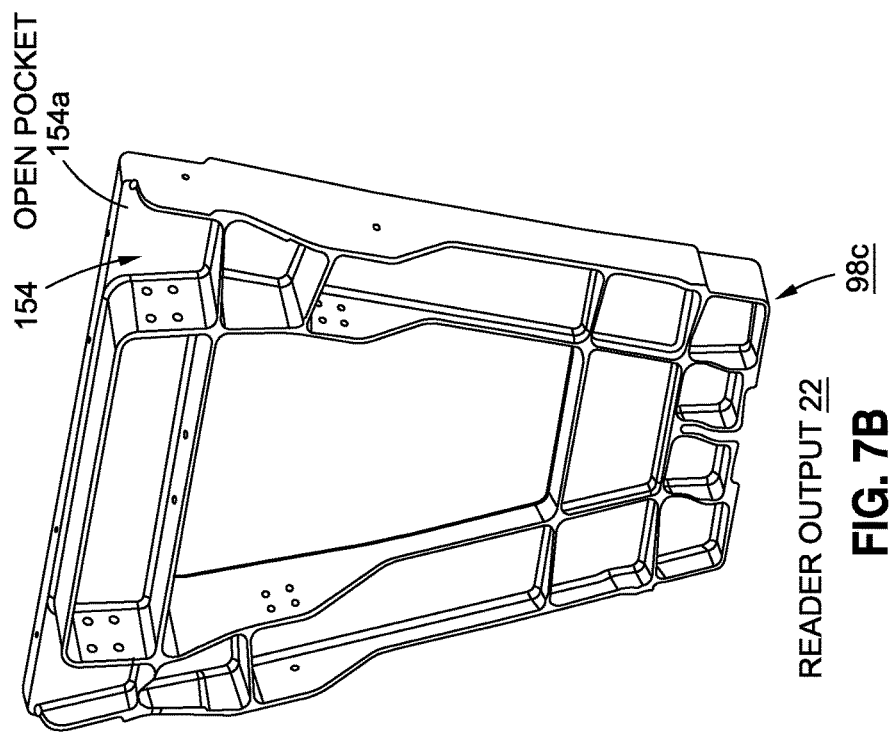
FIG. 7B is an illustration of reader output of pocket features of the pocket surfaces of the frame of FIG. 7A.
Figure 7A:
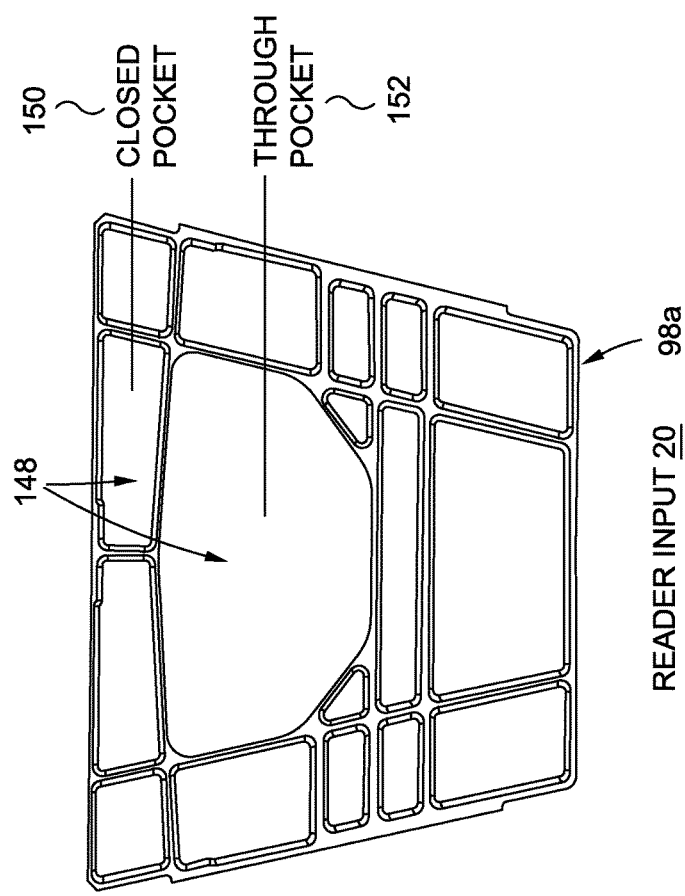
FIG. 7A is an illustration of reader input for pocket surfaces of a frame.

FIG. 7A is an illustration of reader input 20 for pocket surfaces 98a of a frame 56 (see FIG. 3A). FIG. 7A shows frame pocket surfaces 148, such as in the form of a closed pocket 150 and a through pocket 152. FIG. 7B is an illustration of reader output 22 of pocket features 98c of the pocket surfaces 98a (see FIG. 7A) of the frame 56 (see FIG. 3A) of FIG. 7A. FIG. 7B shows a type of pocket 154 identified for the frame 56 (see FIG. 3A), such as in the form of an open pocket 154a. In addition to the type of pocket 154, the pocket features 98c (see FIG. 5B) may also include, for example, stiffeners of the pocket and web thickness.

The pocket reader 98b (see FIG. 2) of the reader tool 18 (see FIG. 2) reads the pocket surfaces 98a (see FIG. 7A) and uses the algorithm 48 (see FIG. 1A) to identify the type of pocket 154 (see FIG. 7B), for example, if the type of pocket 154 (see FIG. 7B) is an open pocket 154a (see FIG. 7B), if it is a closed pocket 150 (see FIG. 7A) or if it has an open end, or if it is a through pocket 152 (see FIG. 7A). Depending on the type of pocket 154 (see FIG. 7B) identified, the construction process may be modified or the feature may be changed.

FIG. 8A is an illustration of reader input 20 of pocket and stiffener surfaces 100a for adjacent pockets 156, 158 and one or more stiffeners 160 shared between the adjacent pockets 156, 158. FIG. 8B is an illustration of reader output 22 of pocket and stiffener features 100c of the pocket and stiffener surfaces 100a for the adjacent pockets 156, 158 and the one or more stiffeners 160 shared between the adjacent pockets 156, 158 of FIG. 8A. FIG. 8B shows a "POCKET 1" pocket number 156a and "POCKET 2" pocket number 158a. The pocket and stiffener features 100c (see FIG. 8B) of the reader output 22 (see FIG. 8B) may include, for example, pocket numbering, stiffener control points, stiffener thickness, and stiffener angle for the pocket and stiffener surfaces 100a (see FIG. 8A).

The stiffener reader 100b (see FIG. 2) of the reader tool 18 (see FIG. 2) reads the pocket and stiffener surfaces 100a (see FIG. 8A) and uses the algorithm 48 (see FIG. 1A) to identify the adjacent pockets 156, 158 and the one or more stiffeners 160 associated with or shared between the adjacent pockets 156, 158. The one or more stiffeners 160 (see FIG. 8A) may be created using control points and spoke lines, and the algorithm 48 (see FIG. 1A) preferably measures the thickness of the one or more stiffeners 160 (see FIG. 8A) and the angle of each of the one or more stiffeners 160 (see FIG. 8A) with respect to the center plane of the frame 56 (see FIG. 3A).

FIG. 9A is an illustration of reader input 20 for pocket and stiffener surfaces 100a. FIG. 9A shows an aft and forward stiffener trim surface profile 162. FIG. 9B is an illustration of reader output 22 for pocket and stiffener features 100c of the pocket and stiffener surfaces 100a of FIG. 9A. FIG. 9B shows a recreated aft and forward stiffener trim surface profile 162a with parameterization.

The stiffener reader 100b (see FIG. 2) of the reader tool 18 (see FIG. 2) reads the pocket and stiffener surfaces 100a (see FIG. 6A) and uses the algorithm 48 (see FIG. 1A) to identify the trim surface profiles for all stiffeners, identify the individual planar profiles, and handle single fillet, two fillet and three fillet scenarios. The algorithm 48 (see FIG. 1A) also identifies the angle of the trim surface for individual trim profiles, recreates the trim profiles with control points, and links them to the stiffener spoke lines and control points.

Figure 10B:
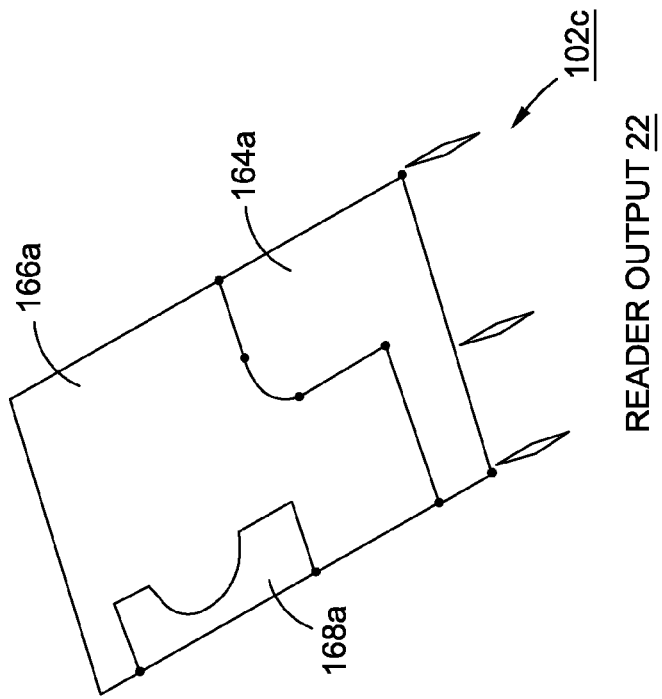
FIG. 10B is an illustration of reader output for the joggle features of the joggles of FIG. 10A.
Figure 10A:
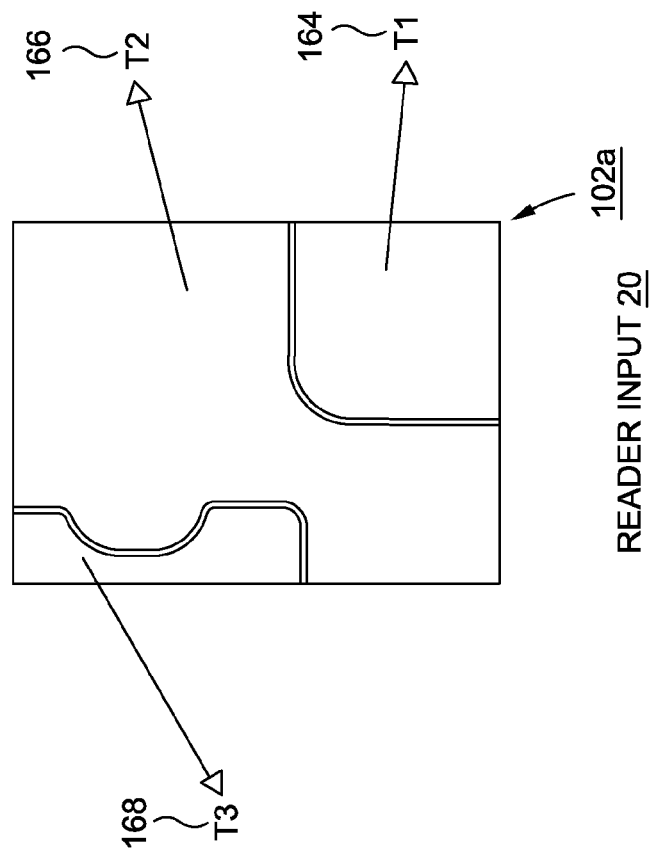
FIG. 10A is an illustration of reader input for joggles.

FIG. 10A is an illustration of reader input 20 for joggles 102a (see also FIG. 2) such as component extract surface and center plane and a surface with multiple thickness regions. As used herein, "joggle" means a local depression performed on a part to provide an adequate mating area with juxtaposed parts. FIG. 10A shows a first thickness region T1 164, a second thickness region T2 166, and a third thickness region T3 168, where T1 is less than T2 is less than T3 (T1<T2<T3).

FIG. 10B is an illustration of reader output 22 for joggle features 102c of the joggles 102a of FIG. 10A. FIG. 10B is an illustration of the reader output 22 of the thickness regions with profiles for transition, for example, for a first thickness region T1 profile 164a, a second thickness region T2 profile 166a, and a third thickness region T3 profile 168a. As shown in FIG. 2, the reader output 22 for the joggle features 102c may comprise reference datum planes and joggle profile.

The joggle reader 102b (see FIG. 2) of the reader tool 18 (see FIG. 2) reads the joggles 102a (see FIG. 2) and uses the algorithm 48 (see FIG. 1A) to read multiple thickness regions and to identify transition regions, and create a profile between adjacent thickness regions for the transition region which will used for creating the multiple thickness region. This methodology avoids any fillets in the transition region and creates construction with edges on which fillets may be created FIG. 11A is an illustration of reader input 20 for a component boundary 104a such as a solid, an inner surface and an outer surface. FIG. 11A shows the component boundary 104a such as an inner surface 170 and an outer surface 172. FIG. 11B is an illustration of reader output 22 of component boundary features 104c of the component boundary 104a of FIG. 11A. The component boundary features 104c (see FIG. 11B) may comprise boundary profile/sketch with profile. FIG. 11B shows a boundary profile 174 of the component boundary 104a.

The component boundary reader 104b (see FIG. 2) of the reader tool 18 (see FIG. 2) reads the component boundary 104a (see FIG. 2) and uses the algorithm 48 (see FIG. 1A) to extract the component boundary 104a using three (3) different methodologies. The component boundary 104a extracted using the algorithm 48 (see FIG. 1A) may be broken down based on the number of profile planes, and sketches are preferably created. The solids are trimmed using the component boundary 104a (see FIG. 2) based on the profile planes for the associated region.

In another embodiment of the disclosure there is provided a system 10 (see FIGS. 1A-1B) for reading geometric data 60 (see FIG. 1A) from a parametric model 36 (see FIG. 1A) or a nonparametric model 38 (see FIG. 1A) from a computer-aided design (CAD) model file 40 (see FIG. 1A). The system 10 (see FIGS. 1A-M) comprises a processor 16 (see FIGS. 1A-1B), such as a computer 16a (see FIGS. 1A-1B). The system 10 (see FIGS. 1A-1B) further comprises a reader system 12 (see FIG. 1A) coupled to the processor 16 (see FIG. 1A). As shown in FIG. 1A, the reader system comprises a reader tool 18 configured to receive reader inputs 20 from an input file 24 and configured to generate reader output 22 to an output file 26. The reader tool 18 (see FIG. 1A) comprise an interface application 42 (see FIG. 1A), which when executed by the processor 16 (see FIG. 1A), is configured to operably receive automatically, using a first interface application 42a (see FIG. 1A), the input file 24 (see FIG. 1A) of a three-dimensional model 32 (see FIG. 1A) comprising data 28 (see FIG. 1A) representing one or more components 30 (see FIG. 1A) of the three-dimensional model 32 (see FIG. 1A), and is further configured to operably determine, using the first interface application 42a (see FIG. 1A), a type 34a (see FIG. 1A) of a part 34 (see FIG. 1A) represented by the three-dimensional model 32 (see FIG. 1A).

The first interface application 42a (see FIG. 1A) comprises instructions 46 (see FIG. 1A), one or more algorithms 48 (see FIG. 1A), or a combination thereof, and is further configured to automatically operably identify, select, and group geometric data 60 (see FIG. 1A) associated with specific geometric data 60a (see FIG. 1A) of the three-dimensional model 32 (see FIG. 1A), based on a set of parametric rules 50 (see FIG. 1A), and to operably extract from the first input file 24a (see FIG. 1A), a portion 60b (see FIG. 1A) of the geometric data 60 (see FIG. 1A) representing the specific geometric data 60a (see FIG. 1A), to obtain extracted specific geometric data 60c (see FIG. 1A).

The portion 60b (see FIG. 1A) of the geometric data 60 (see FIG. 1A) representing the specific geometric data 60c (see FIG. 1A) is extracted automatically by the first interface application 42b (see FIG. 1A), and the processor 16 (see FIG. 1A) writes the extracted specific geometric data 60c (see FIG. 1A) to the output file 26 (see FIG. 1A) comprising a first geometry intermediate output file 26a (see FIG. 1A), based on the extracted specific geometric data 60c (see FIG. 1A), and further wherein the first geometry intermediate output file 26a (see FIG. 1A) comprises language-neutral data 66 (see FIG. 1A) for the part 34 (see FIG. 1A) from which a finite element model 68 (see FIG. 1A) may be generated to form a part model 35 (see FIG. 1A), after the type 34a (see FIG. 1A) of the part 34 (see FIG. 1A) represented by the three-dimensional model 32 (see FIG. 1A) is determined and after the extracted specific geometric data 60c (see FIG. 1A) is extracted.

The system 10 (see FIG. 1B) further comprises a creator system 14 (see FIG. 1B) coupled to the reader system 12 (see FIG. 1A) and the processor 16 (see FIG. 1B). The creator system 14 (see FIG. 1B) comprises a creator tool 70 (see FIG. 1B) that uses a second interface application 42b (see FIG. 1B) to receive creator input 72 (see FIG. 1B) from the first geometry intermediate output file 26a (see FIG. 1B), and is configured to generate one or more creator outputs 74 (see FIG. 1B) to one or more output files 26 (see FIG. 1B). The interface application 42 (see FIG. 1B) is further configured to operably create automatically, using the second interface application 42b (see FIG. 1B), parameterized geometry data 76 (see FIG. 1B) comprising geometric data 60 (see FIG. 1B) for one or more components 30 (see FIG. 1B) of the part model 35 (see FIG. 1B), and attributes 78 (see FIG. 1B) defining relationships 80 (see FIG. 1B) between the one or more components 30 (see FIG. 1B) of the part model 35 (see FIG. 1B) based on a set of predefined rules 81 (see FIG. 1B).

The interface application 42 (see FIG. 1B) is further configured to operably write, using the second interface application 42b (see FIG. 1B), the parameterized geometry data 76 (see FIG. 1B) to a second geometry data output file 26b (see FIG. 1B) corresponding to a part model to be analyzed 35a (see FIG. 1B). The interface application 42 (see FIG. 1B) is further configured to automatically, without user input 44 (see FIG. 3B), generate the finite element model 68 (see FIG. 1B) from the second geometry data output file 26b (see FIG. 1B).

The first interface application 42 (see FIG. 1B) is further configured to modify the finite element model 68 (see FIG. 1B) to form a modified finite element model 68a (see FIG. 1B) using a finite element model generation application 82 (see FIG. 1B). The first interface application 42 (see FIG. 1B) is further configured to write automatically, without user input 44 (see FIG. 3B), a third geometry data output file 26c (see FIG. 1B) comprising modified geometric data 60d (see FIG. 1B) for the one or more components 30 (see FIG. 1B)

of the part model 35 (see FIG. 1B), based on modifications 84 (see FIG. 1B) made to the modified finite element model 68*a* (see FIG. 1B). The first interface application 42 (see FIG. 1B) is further configured to generate automatically, without user input 44 (see FIG. 3B), a final design application model output file 26*d* (see FIG. 1B) of the modified part model 35*b* (see FIG. 1B) from the third geometry data output file 26*c* (see FIG. 3B), wherein the final design application model output file 26*d* (see FIG. 1B) comprises modified geometric data 60*d* (see FIG. 1B) for the one or more components 30 (see FIG. 1B) of the part model 35 (see FIG. 1B), based on the modifications 84 (see FIG. 1B) made to the modified finite element model 68*a* (see FIG. 1B).

Figure 12:
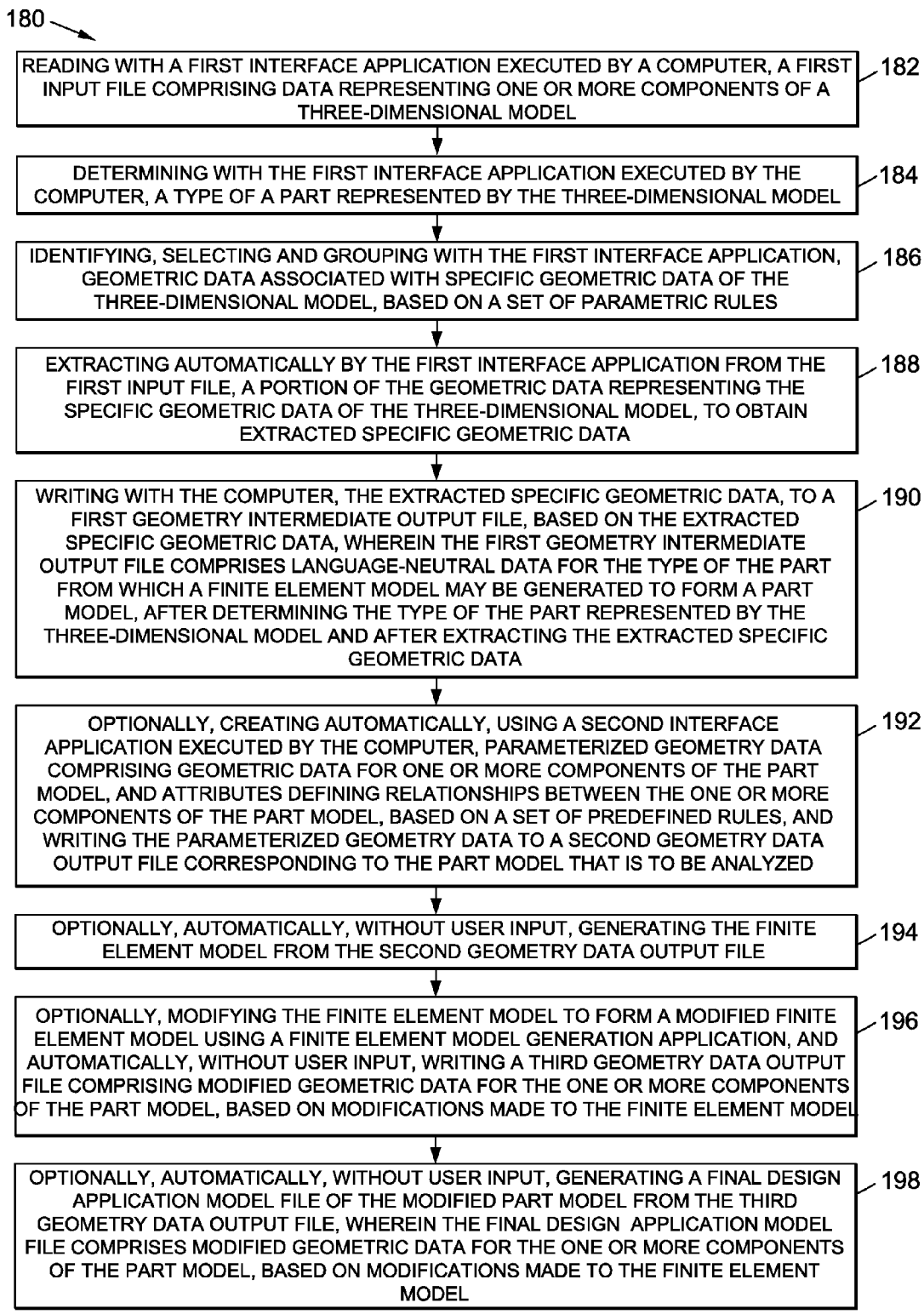
FIG. 12 is an illustration of a flow diagram showing an embodiment of a method of the disclosure.

In another embodiment there is provided a computer-executable method 150 (see FIG. 11) for reading geometric data from a computer-aided design (CAD) model file. FIG. 12 is an illustration of a flow diagram showing an embodiment of the method 180 of the disclosure.

As shown in FIG. 12, the method 180 comprises step 182 of reading with a first interface application 42*a* (see FIG. 1A) executed by a computer 16*a* (see FIG. 1A), a first design application model file 24*b* (see FIG. 1A). The first design application model file 24*b* (see FIG. 1A) comprises data 28 (see FIG. 1A) representing one or more components 30 (see FIG. 1A) of a three-dimensional model 32 (see FIG. 1A). The step 182 of reading the first design application model file 24*b* (see FIG. 1A) preferably comprises reading the first design application model file 24*b* (see FIG. 1A) comprising a computer aided three-dimensional interactive application (CATIA) part model file 40*a* (see FIG. 1A).

As shown in FIG. 12, the method 180 further comprises step 184 of determining with the first interface application 42*a* (see FIG. 1A) executed by the computer 16*a* (see FIG. 1A), a type 34*a* (see FIG. 1A) of a part 34 (see FIG. 1A) represented by the three-dimensional model 32 (see FIG. 1A). The step 184 of determining the type 34*a* (see FIG. 1A) of the part 34 (see FIG. 1A) represented by the three-dimensional model 32 (see FIG. 1A) preferably comprises determining the type 34*a* (see FIG. 1A) of the part 34 (see FIG. 1A) associated with one of a panel 54 (see FIG. 3A), a frame 56 (see FIG. 3A), or a chord 58 (see FIG. 3A), or wherein the type 34*a* (see FIG. 1A) of the part 34 (see FIG. 1A) comprises generic geometric information 118 (see FIG. 3A).

As shown in FIG. 12, the method 180 further comprises step 186 of identifying, selecting and grouping with the first interface application 42*a* (see FIG. 1A), geometric data 60 (see FIG. 1A) associated with specific geometric data 60*a* (see FIG. 1A) of the three-dimensional model 32 (see FIG. 1A), based on a set of parametric rules 50 (see FIG. 1A). The step 186 of identifying, selecting and grouping the geometric data 60 (see FIG. 1A) preferably comprises identifying, selecting and grouping geometric data 60 (see FIG. 1A) associated with the specific geometric data 60*a* (see FIG. 1A) comprising a specific component 30*a* (see FIG. 1A) of the three-dimensional model 32 (see FIG. 1A), a specific feature 30*b* (see FIG. 1A) of the three-dimensional model 32 (see FIG. 1A), or a combination thereof.

As shown in FIG. 12, the method 180 further comprises step 188 of extracting automatically by the first interface application 42*a* (see FIG. 1A) from the first design application model file 24*b* (see FIG. 1A), a portion 60*b* (see FIG. 1A) of the geometric data 60 (see FIG. 1A) representing the specific geometric data 60*a* (see FIG. 1A) of the three-dimensional model 32 (see FIG. 1A), to obtain extracted specific geometric data 60*c* (see FIG. 1A).

As shown in FIG. 12, the method 180 further comprises step 190 of writing with the computer 16*a* (see FIG. 1A), the extracted specific geometric data 60*c* (see FIG. 1A) to a first geometry intermediate output file 26*a* (see FIG. 1A), based on the extracted specific geometric data 60*c* (see FIG. 1A). The first geometry intermediate output file 26*a* (see FIG. 1A) comprises intermediate data 62 (see FIG. 1A) in the form of numerical data 64, and further comprises language-neutral data 66 (see FIG. 1A) for the type 34*a* (see FIG. 1A) of the part 34 (see FIG. 1A). A finite element model 68 (see FIG. 1B) may be generated from the part 34 (see FIG. 1A) to form a part model 35 (see FIG. 1B), after determining the type 34*a* (see FIG. 1A) of the part 34 (see FIG. 1A) represented by the three-dimensional model 32 (see FIG. 1A) and after extracting the extracted specific geometric data 60*c* (see FIG. 1A).

As shown in FIG. 12, the method 180 further comprises optional steps 192 of creating automatically, using a second interface application 42*b* (see FIG. 1B) executed by the computer 16*a* (see FIG. 1B), parameterized geometry data 76 (see FIG. 1B) comprising geometric data 60 (see FIG. 1B) for one or more components 30 (see FIG. 1B) of the part model 35 (see FIG. 1B), and attributes 78 (see FIG. 1B) defining relationships 80 (see FIG. 1B) between the one or more components 30 (see FIG. 1B) of the part model 35 (see FIG. 1B), based on a set of predefined rules 81 (see FIG. 1B), and writing the parameterized geometry data 76 (see FIG. 1B) to a second geometry data output file 26*b* (see FIG. 1B) corresponding to a part model to be analyzed 35*a* (see FIG. 1B).

As shown in FIG. 12, the method 180 further comprises optional step 194 of automatically, without user input 44 (see FIG. 3B), generating the finite element model (FEM) 68 (see FIG. 1B) from the second geometry data output file 26*b* (see FIG. 1B).

As shown in FIG. 12, the method 180 further comprises optional steps 196 of modifying the finite element model 68 (see FIG. 1B) to form a modified finite element model 68*a* (see FIG. 1B) using a finite element model generation application 82 (see FIG. 1B), and automatically, without user input 44 (see FIG. 3B), writing with the computer 16*a* (see FIG. 1B), a third geometry data output file 26*c* (see FIG. 1B) comprising modified geometric data 60*d* (see FIG. 1B) for the one or more components 30 (see FIG. 1B) of the part model 35 (see FIG. 1B), based on modifications 84 (see FIG. 1B) made to the finite element model 68 (see FIG. 1B).

As shown in FIG. 12, the method 180 further comprises optional step 198 of automatically, without user input 44 (see FIG. 3B), generating a final design application model file 26*d* (see FIG. 1B) of the modified part model 35*b* (see FIG. 1B) from the third geometry data output file 26*c* (see FIG. 1B). The final design application output model file 26*d* (see FIG. 1B) comprises the modified geometric data 60*d* (see FIG. 1B) for the one or more components 30 (see FIG. 1B) of the part model 35 (see FIG. 1B), based on the modifications 84 (see FIG. 1B) made to the finite element model 68 (see FIG. 1B).

Figure 13:
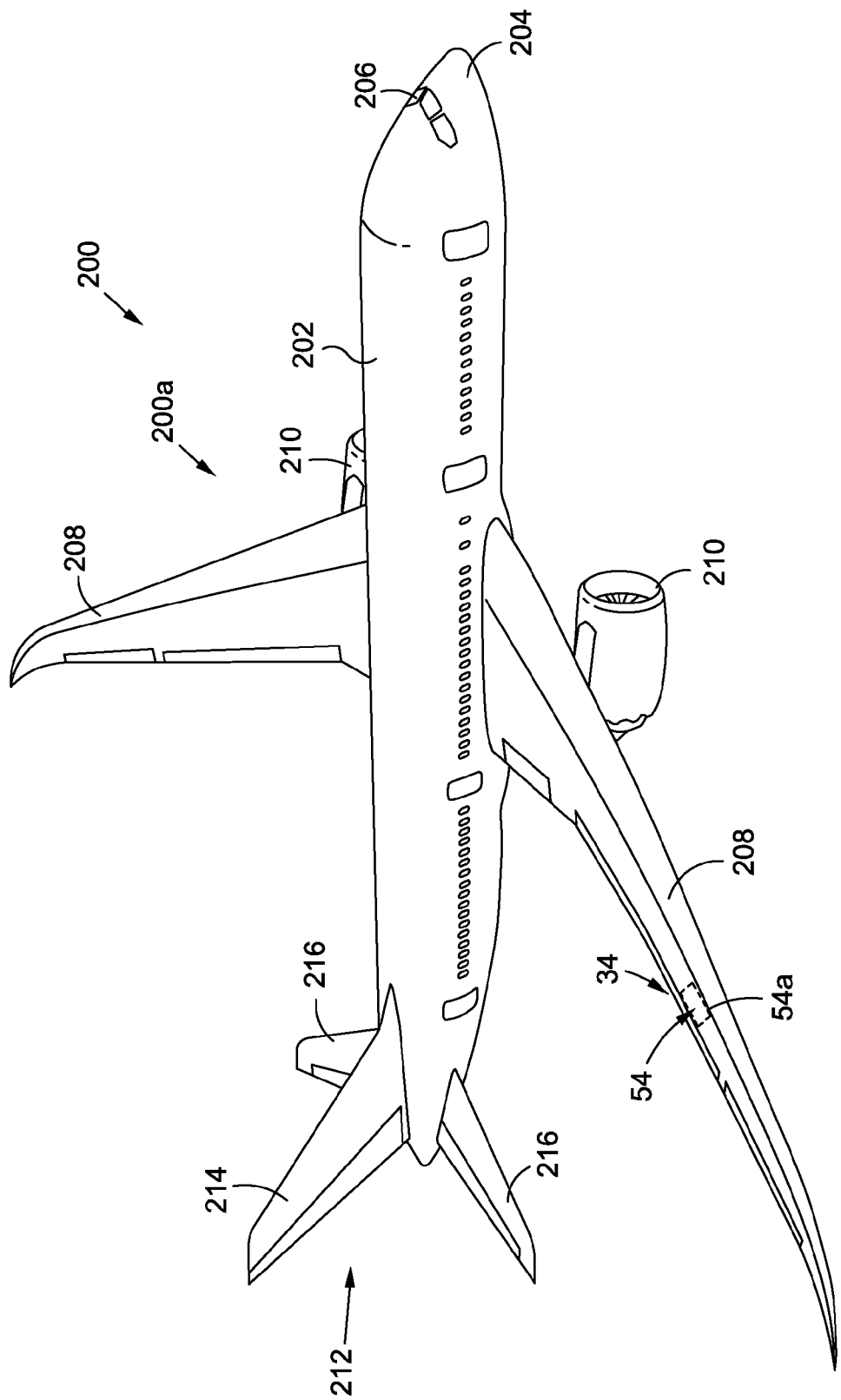
FIG. 13 is an illustration of a perspective view of an aircraft that includes parts that may be designed using one of the embodiments of the system and method of the disclosure.

FIG. 13 is an illustration of a perspective view of an air vehicle 200, such as an aircraft 200*a*, that includes one or more parts 34, such as, for example a panel 54, in the form of a wing panel 54*a*, that may be designed using one of the embodiments of the system 10 and method 180 of the disclosure. As shown in FIG. 13, the aircraft 200*a* comprises such components as a fuselage 202, a nose 204, a cockpit 206, wings 208, one or more propulsion units 210, and a tail 212 comprising a vertical tail portion 214 and horizontal tail portions 216.

Although the aircraft 200a shown in FIG. 13 is generally representative of a commercial passenger aircraft having one or more parts 34, such as the panel 54, in the form of a wing panel 54a, the teachings of the disclosed embodiments may be applied to other passenger aircraft. For example, the teachings of the disclosed embodiments may be applied to cargo aircraft, military aircraft, rotorcraft, and other types of aircraft or aerial vehicles, as well as aerospace vehicles, satellites, space launch vehicles, rockets, and other aerospace vehicles.

Figure 14:
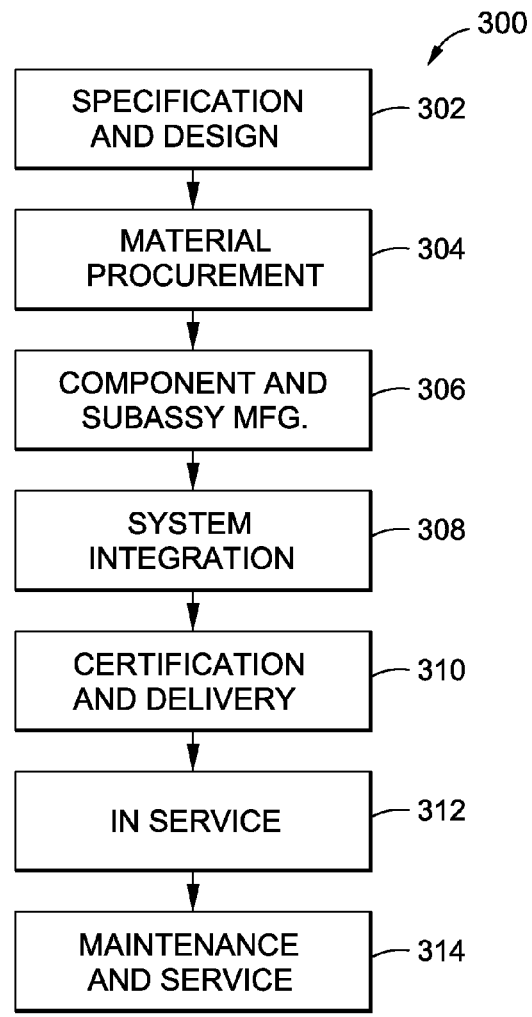
FIG. 14 is an illustration of a flow diagram of an aircraft manufacturing and service method; and, FIG. 15 is an illustration of a block diagram of an aircraft.
Figure 15:
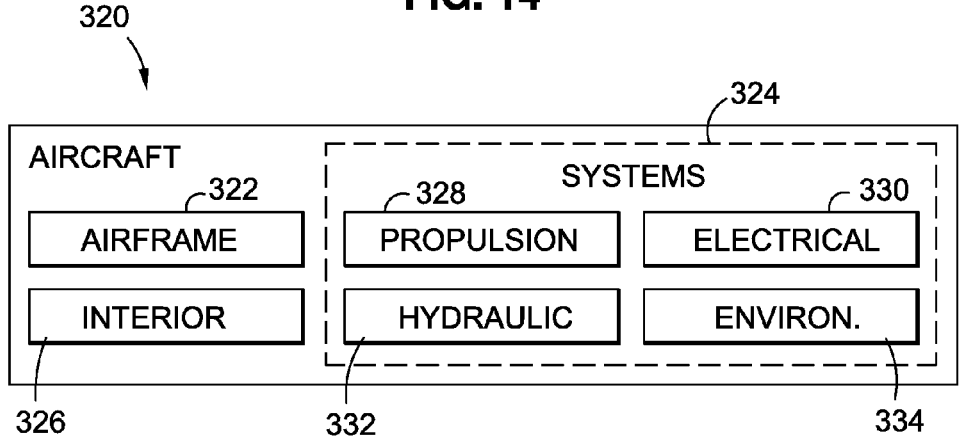

FIG. 14 is an illustration of a flow diagram of an aircraft manufacturing and service method 300. FIG. 15 is an illustration of a block diagram of an aircraft 320. Referring to FIGS. 14-15, embodiments of the disclosure may be described in the context of the aircraft manufacturing and service method 300 as shown in FIG. 14, and the aircraft 320 as shown in FIG. 15.

During pre-production, exemplary aircraft manufacturing and service method 300 may include specification and design 302 of the aircraft 320 and material procurement 304. During manufacturing, component and subassembly manufacturing 306 and system integration 308 of the aircraft 320 takes place. Thereafter, the aircraft 320 may go through certification and delivery 310 in order to be placed in service 312. While in service 312 by a customer, the aircraft 320 may be scheduled for routine maintenance and service 314 (which may also include modification, reconfiguration, refurbishment, and other suitable services).

Each of the processes of the aircraft manufacturing and service method 300 may be performed or carried out by a system integrator, a third party, and/or an operator (e.g., a customer). For the purposes of this description, a system integrator may include, without limitation, any number of aircraft manufacturers and major-system subcontractors. A third party may include, without limitation, any number of vendors, subcontractors, and suppliers. An operator may include an airline, leasing company, military entity, service organization, and other suitable operators.

As shown in FIG. 15, the aircraft 320 produced by the exemplary aircraft manufacturing and service method 300 may include an airframe 322 with a plurality of systems 324 and an interior 326. Examples of the plurality of systems 324 may include one or more of a propulsion system 328, an electrical system 330, a hydraulic system 332, and an environmental system 334. Any number of other systems may be included. Although an aerospace example is shown, the principles of the disclosure may be applied to other industries, such as the automotive industry.

Methods and systems embodied herein may be employed during any one or more of the stages of the aircraft manufacturing and service method 300. For example, components or subassemblies corresponding to component and subassembly manufacturing 306 may be fabricated or manufactured in a manner similar to components or subassemblies produced while the aircraft 320 is in service 312. Also, one or more apparatus embodiments, method embodiments, or a combination thereof, may be utilized during component and subassembly manufacturing 306 and system integration 308, for example, by substantially expediting assembly of or reducing the cost of the aircraft 320. Similarly, one or more of apparatus embodiments, method embodiments, or a combination thereof, may be utilized while the aircraft 320 is in service 312, for example and without limitation, to maintenance and service 314.

Disclosed embodiments of the system 10 (see FIGS. 1A-1B) and method 180 (see FIG. 12) provide a novel system and method for reading geometric data 60 (see FIG. 1A) from a CAD model file 40 (see FIG. 1A), such as a CATIA part model file 40a (see FIG. 1A), then identifying geometric data 60 (see FIG. 1A) associated with specific components 30a (see FIG. 1A) and/or specific features 30b (see FIG. 1A), and extracting automatically by an interface application 42 (see FIG. 1A), geometric data 60 (see FIG. 1A) specific to the specific components 30a (see FIG. 1A) and/or specific features 30b (see FIG. 1A). The specific geometric data 60a (see FIG. 1A) is then written or transformed to an output file 26 (see FIG. 1A), such as a first geometry intermediate output file 26a (see FIG. 1A), that includes intermediate data 62 (see FIG. 1A) that is numerical data 64 (see FIG. 1A) and that includes language-neutral data 66 (see FIG. 1A) from which a parametric model 36 (see FIG. 1A), or parameterized model, and a finite element model 68 (see FIG. 1B) may be generated.

In addition, disclosed embodiments of the system 10 (see FIGS. 1A-1B) and method 180 (see FIG. 12) use instructions, one or more algorithms, or a combination thereof to capture the geometric data 60 (see FIG. 1A) in the CAD model file 40 (see FIG. 1A). Disclosed embodiments of the system 10 (see FIGS. 1A-1B) and method 180 (see FIG. 12) achieve development of a cognitive algorithm for feature recognition, development of a generic algorithm for the feature library to be used across components for various programs, development of an algorithm to extract and update thicknesses in CAD and CAE platforms, development of an algorithm to understand the relationship and dependency among various features, and integration of design and analysis processes.

Moreover, disclosed embodiments of the system 10 (see FIGS. 1A-1B) and method 180 (see FIG. 12) are able to capture all the CAD features of the three-dimensional model 32 (see FIG. 1A) and convert a CATIA V4 (version four) part model file to a parameterized CATIA V5 (version five) part model file automatically, quickly without manual work, and with less conversion costs than known systems and methods for converting CATIA V4 to CATIA V5. Further, the reader tool 18 (see FIG. 1A) converts CATIA V4 to CATIA V5 with minimal error. In addition, a parametric model 36 (see FIG. 1A) may be used for design modifications very quickly.

Also, disclosed embodiments of the system 10 (see FIGS. 1A-1B) and method 180 (see FIG. 12) provide a reader system 12 (see FIG. 1A) with a reader tool 18 (see FIG. 1A) that allows for reading of non-parameterized CATIA V4 files, for extracting all the various features of the three-dimensional model 32 (see FIG. 1A) of the part 34 (see FIG. 1A), and for generating the reader output 22 (see FIG. 1A) and converting the CATIA V4 files to CATIA V5 files. In addition, disclosed embodiments of the system 10 (see FIGS. 1A-1B) and method 180 (see FIG. 12) provide a creator system 14 (see FIG. 1B) with a creator tool 70 (see FIG. 1B) that allows creation of a CATIA V5 parameterized three-dimensional model, or alternatively, that takes raw geometric data and uses the raw geometric data for creating a parameterized model in another software besides CATIA V5. The creator tool 70 (see FIG. 1B) is able to read the intermediate data or output created by the reader tool 18 (see FIG. 1A). Moreover, all the parameterized features may be documented and shown in detail for users and may be used for other software.

Thus, disclosed embodiments of the system 10 (see FIGS. 1A-1B) and method 180 (see FIG. 12) facilitate the conversion of any CATIA models from CATIA V4 to CATIA V5 and fix most of the conversion errors which may occur with known conversion systems and methods. Further, disclosed embodiments of the system 10 (see FIGS. 1A-1B) and method 180 (see FIG. 12) capture the geometric features of CATIA V4 models (dumb solid or model with geometry tree), for use in building a parameterized CATIA V5 model, and capture automatically the design attributes of the features in an intermediate output file.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. A system for reading geometric data from a parametric model a nonparametric model from a computer-aided design (CAD) model file, the system comprising:
   a processor; and
   an interface application, which when executed by the processor, is configured to operably receive automatically, using a first interface application, an input file of a three-dimensional model comprising data representing more components of the three-dimensional model, and is further configured to operably determine, using the first interface application, a type of a part represented by the three-dimensional model;
   the first interface application comprising instructions, one or more algorithms, or a combination thereof, and being further configured to automatically operably identify, select, and group geometric data associated with specific geometric data of the three-dimensional model, based on a set of parametric rules, and to operably extract from the input file, a portion of the geometric data representing the specific geometric data, to obtain extracted specific geometric data;
   wherein the portion of the geometric data representing the specific geometric data is extracted automatically by the first interface application, and the processor writes the extracted specific geometric data to an output file comprising a first geometry intermediate output file, based on the extracted specific geometric data, and further wherein the first geometry intermediate output file comprises language-neutral data for the part from which a finite element model may be generated to form a part model, after the type of the part represented by the three-dimensional model is determined and after the extracted specific geometric data is extracted,
   and further wherein the interface application is further configured to operably create automatically, using a second interface application, parameterized geometry data comprising geometric data for one or more components of the part model, and attributes defining relationships between the one or more components of the part model based on a set of predefined rules, and is further configured to operably write, using the second interface application, the parameterized geometry data to a second geometry data output file corresponding to a part model to be analyzed,
   and further wherein the interface application is further configured to operably generate automatically, without user input, the finite element model from the second geometry data output file.

2. The system of claim 1, wherein the interface application is further configured to operably modify the finite element model to form a modified finite element model using a finite element model generation application, and is further configured to operably write automatically, without user input, a third geometry data file comprising modified geometric data for the one or more components of the part model, based on modifications made to the finite element model.

3. The system of claim 2, wherein the interface application is further configured to operably generate automatically, without user input, a final design application output model file of a modified part model from the third geometry data output file, wherein the final design application output model file comprises modified geometric data for the one or more components of the part model, based on the modifications made to the finite element model.

4. The system of claim 1, wherein the system further comprises a reader system with a reader tool that uses the first interface application to read the input file and that is configured to generate reader output to the output file comprising the first geometry intermediate output file.

5. The system of claim 1, wherein the system further comprises a creator system with a creator tool that uses the second interface application to receive creator input from the first geometry intermediate output file, and is configured to generate one or more creator outputs.

6. The system of claim 1, wherein the type of the part is associated with one of a panel, a frame, or a chord, or wherein the type of the part comprises generic geometric information.

7. The system of claim 1, wherein the specific geometric data of the three-dimensional model comprises a specific component of the three-dimensional model, a specific feature of the three-dimensional model, or a combination thereof.

8. The system of claim 1, wherein the computer-aided design (CAD) model file comprises a computer aided three-dimensional interactive application (CATIA) part model file.

9. A system for reading geometric data from a parametric model or a nonparametric model from a computer-aided design (CAD) model file, the system comprising:
   a processor;
   a reader system coupled to the processor, the reader system comprising a reader tool configured to receive reader inputs from an input file and configured to generate reader output to an output file, wherein the reader tool comprises:
      an interface application, which when executed by the processor, is configured to operably receive automatically, using a first interface application, the input file of a three-dimensional model comprising data representing one or more components of the three-dimensional model, and is further configured to operably determine, using the first interface application, a type of a part represented by the three-dimensional model;
      the first interface application comprising instructions, one or more algorithms, or a combination thereof, and being further configured to automatically operably identify, select, and group geometric data associated with specific geometric data of the three-dimensional model, based on a set of parametric rules, and to operably extract from the input file, a portion of the geometric data representing the specific geometric data, to obtain extracted specific geometric data;
      wherein the portion of the geometric data representing the specific geometric data is extracted automatically by the first interface application, and the processor writes the extracted specific geometric data to the output file comprising a first geometry intermediate output file, based on the extracted specific geometric data, and further wherein the first geometry intermediate output file comprises language-neutral data for the part from which a finite element model may be generated to form a part model, after the type of the part represented by the three-dimensional model is determined and after the extracted specific geometric data is extracted; and a creator system coupled to the reader system and the processor, the creator system comprising a creator tool that uses a second interface application to receive creator input from the first geometry intermediate output file, and is configured to generate one or more creator outputs to one or more output files, wherein the interface application is further configured:

to operably create automatically, using a second interface application, parameterized geometry data comprising geometric data for one or more components of the part model, and attributes defining relationships between the one or more components of the part model based on a set of predefined rules;

to operably write, using the second interface application, the parameterized geometry data to a second geometry data output file corresponding to a part model to be analyzed; and to automatically, without user input, generate the finite element model from the second geometry data output file.

10. The system of claim 9, wherein the first interface application is further configured:

to modify the finite element model to form a modified part model using a finite element model generation application;

to write automatically, without user input, a third geometry data output file comprising modified geometric data for the one or more components of the part model, based on modifications made to the modified finite element model.

11. The system of claim 10, wherein the first interface application is further configured:

to generate automatically, without user input, a final design application model output file of a modified part model from the third geometry data output file, wherein the final design application model output file comprises modified geometric data for the one or more components of the part model, based on the modifications made to the modified finite element model.

12. The system of claim 9, wherein the type of the part is associated with one of a panel, a frame, or a chord, or wherein the type of the part comprises generic geometric information.

13. The system of claim 9, wherein the specific geometric data of the three-dimensional model comprises a specific component of the three-dimensional model, a specific feature of the three-dimensional model, or a combination thereof.

14. The system of claim 9, wherein the computer-aided design (CAD) model file comprises a computer aided three-dimensional interactive application (CATIA) part model file.

15. A computer-executable method for reading geometric data from a computer-aided design (CAD) model file, the method comprising the steps of:

reading with a first interface application executed by a computer, a first input file comprising data representing one or more components of a three-dimensional model;

determining with the first interface application executed by the computer, a type of a part represented by the three-dimensional model;

identifying, selecting and grouping with the first interface application, geometric data associated with specific geometric data of the three-dimensional model, based on a set of parametric rules;

extracting automatically by the first interface application from the first input file, a portion of the geometric data representing the specific geometric data of the three-dimensional model, to obtain extracted specific geometric data;

writing with the computer, the extracted specific geometric data, to a first geometry intermediate output file, based on the extracted specific geometric data, wherein the first geometry intermediate output file comprises language-neutral data for the type of the part from which a finite element model may be generated to form a part model, after determining the type of the part represented by the three-dimensional model and after extracting the extracted specific geometric data;

creating automatically, using a second interface application executed by the computer, parameterized geometry data comprising geometric data for one or more components of the part model, and attributes defining relationships between the one or more components of the part model, based on a set of predefined rules;

writing the parameterized geometry data to a second geometry data output file corresponding to the part model that is to be analyzed; and automatically, without user input, generating the finite element model from the second geometry data output file.

16. The method of claim 15, further comprising the steps of:

modifying the finite element model to form a modified finite element model using a finite element model generation application; and automatically, without user input, writing a third geometry data file comprising modified geometric data for the one or more components of the part model, based on modifications made to the finite element model.

17. The method of claim 16, further comprising the step of:

automatically, without user input, generating a final design application model file of the modified part model from the third geometry data output file, wherein the final design application model file comprises modified geometric data for the one or more components of the part model, based on modifications made to the finite element model.

18. The method of claim 15, wherein the computer-aided design (CAD) model file comprises a computer aided three-dimensional interactive application (CATIA) part model file.

19. The method of claim 15 wherein the step of determining the type of the part represented by the three-dimensional model comprises determining the type of the part associated with one of a panel, a frame, or a chord, or determining the type of the part comprises generic geometric information.

20. The method of claim 15, wherein the step of identifying, selecting and grouping geometric data comprises identifying, selecting and grouping geometric data associated with the specific geometric data comprising a specific component of the three-dimensional model, a specific feature of the three-dimensional model, or a combination thereof.

\* \* \* \* \*

UNITED STATES PATENT AND TRADEMARK OFFICE
CERTIFICATE OF CORRECTION

PATENT NO. : 9,754,053 B2  
APPLICATION NO. : 14/457110  
DATED : September 5, 2017  
INVENTOR(S) : Mohammad Ali Heidari et al.

Page 1 of 1

It is certified that error appears in the above-identified patent and that said Letters Patent is hereby corrected as shown below:

On the Title Page

Item (57) ABSTRACT, Line 2: Please add the word --a-- before "parametric model"

In the Claims

Column 17, (Line 18) Claim 1, Line 2: Please add the word --or-- before "a nonparametric model"

Signed and Sealed this  
Twenty-sixth Day of March, 2019

Andrei Iancu  
*Director of the United States Patent and Trademark Office*